US007342224B2

(12) United States Patent
Makarov et al.

(10) Patent No.: US 7,342,224 B2
(45) Date of Patent: Mar. 11, 2008

(54) OBTAINING TANDEM MASS SPECTROMETRY DATA FOR MULTIPLE PARENT IONS IN AN ION POPULATION

(75) Inventors: Alexander Alekseevich Makarov, Cheadle Hume (GB); John Edward Philip Syka, Charlottesville, VA (US)

(73) Assignee: Thermo Finnigan LLC, San Jose, CA (US)

( * ) Notice: Subject to any disclaimer, the term of this patent is extended or adjusted under 35 U.S.C. 154(b) by 0 days.

(21) Appl. No.: 11/494,405

(22) Filed: Jul. 26, 2006

(65) Prior Publication Data

US 2006/0284080 A1 Dec. 21, 2006

Related U.S. Application Data

(63) Continuation of application No. 10/804,692, filed on Mar. 19, 2004, now Pat. No. 7,157,698.

(60) Provisional application No. 60/456,569, filed on Mar. 19, 2003.

(51) Int. Cl.
*H01L 49/10* (2006.01)
*H01L 49/00* (2006.01)

(52) U.S. Cl. ...................... 250/290; 250/288; 250/281; 250/282; 250/293

(58) Field of Classification Search ................ 250/288, 250/290
See application file for complete search history.

(56) References Cited

U.S. PATENT DOCUMENTS

| | | | | |
|---|---|---|---|---|
| 4,963,736 | A * | 10/1990 | Douglas et al. | 250/292 |
| 5,464,975 | A * | 11/1995 | Kirchner et al. | 250/283 |
| 5,847,386 | A * | 12/1998 | Thomson et al. | 250/288 |
| 6,222,185 | B1 * | 4/2001 | Speakman et al. | 250/288 |
| 6,525,328 | B1 * | 2/2003 | Miyoshi et al. | 250/492.22 |
| 6,545,270 | B2 * | 4/2003 | Speakman et al. | 250/288 |
| 6,649,909 | B2 * | 11/2003 | Russ et al. | 250/288 |
| 6,707,032 | B2 * | 3/2004 | Speakman et al. | 250/281 |
| 6,730,904 | B1 * | 5/2004 | Wells | 250/292 |
| 6,891,157 | B2 * | 5/2005 | Bateman et al. | 250/292 |
| 6,897,438 | B2 * | 5/2005 | Soudakov et al. | 250/288 |
| 6,956,205 | B2 | 10/2005 | Park | |
| 7,045,797 | B2 * | 5/2006 | Sudakov et al. | 250/292 |
| 7,157,698 | B2 * | 1/2007 | Makarov et al. | 250/281 |
| 2004/0222369 | A1 * | 11/2004 | Makarov et al. | 250/281 |
| 2006/0284080 | A1 * | 12/2006 | Makarov et al. | 250/290 |
| 2007/0045531 | A1 * | 3/2007 | Mordehai et al. | 250/285 |
| 2007/0057178 | A1 * | 3/2007 | Chemushevich et al. | 250/288 |

* cited by examiner

*Primary Examiner*—David A. Vanore
*Assistant Examiner*—Bernard Souw
(74) *Attorney, Agent, or Firm*—Charles B. Katz

(57) ABSTRACT

This invention relates to tandem mass spectrometry and, in particular, to tandem mass spectrometry using a linear ion trap and a time of flight detector to collect mass spectra to form a MS/MS experiment. The accepted standard is to store and mass analyze precursor ions in the ion trap before ejecting the ions axially to a collision cell for fragmentation before mass analysis of the fragments in the time of flight detector. This invention makes use of orthogonal ejection of ions with a narrow range of m/z values to produce a ribbon beam of ions that are injected into the collision cell. The shape of this beam and the high energy of the ions are accommodated by using a planar design of collision cell. Ions are retained in the ion trap during ejection so that successive narrow ranges may be stepped through consecutively to cover all precursor ions of interest.

18 Claims, 14 Drawing Sheets

Partitioning of Rod Electrodes to Allow For x Field gradient

Planar Ion Guide With Connections To Allow Z Focusing

Planar Ion Guide With Connections To Allow Z Focusing And Gradient in X

Circuitry To Create Need DC Voltages
For Planar Ion Guide

Estimated Voltages $V_Z \approx 4$ Volts $V_X \sim 0.5$ Volts or Less

OBTAINING TANDEM MASS SPECTROMETRY DATA FOR MULTIPLE PARENT IONS IN AN ION POPULATION

CROSS-REFERENCE TO RELATED APPLICATIONS

This application is a continuation of U.S. patent application Ser. No. 10/804,692, filed Mar. 19, 2004, now U.S. Pat. No. 7,157,698 entitled "Obtaining Tandem Mass Spectrometry Data for Multiple Parent Ions in an Ion Population", which claims priority from U.S. Provisional Patent Application No. 60/456,569, filed Mar. 19, 2003, which applications are incorporated herein by reference in their entireties.

BACKGROUND OF THE INVENTION

This invention relates to tandem mass spectrometry. In particular, although not exclusively, this invention relates to tandem mass spectrometry using an ion trap to analyze and select precursor ions and a time-of-flight (TOF) analyzer to analyze fragment ions.

Structural elucidation of ionized molecules is often carried out using a tandem mass spectrometer, where a particular precursor ion is selected at the first stage of analysis or in the first mass analyzer (MS-1), the precursor ions are subjected to fragmentation (e.g. in a collision cell), and the resulting fragment (product) ions are transported for analysis in the second stage or second mass analyzer (MS-2). The method can be extended to provide fragmentation of a selected fragment, and so on, with analysis of the resulting fragments for each generation. This is typically referred to an $MS^n$ spectrometry, with n indicating the number of steps of mass analysis and the number of generations of ions. Accordingly, $MS^2$ corresponds to two stages of mass analysis with two generations of ions analyzed (precursor and products).

Relevant types of tandem mass spectrometers include:

1. Sequential in space:

a. Magnetic sector hybrids (4-sector, Mag-Trap, Mag-TOF, etc). See for example F. W. McLafferty; Ed. Tandem mass spectrometry; Wiley-Interscience: New York; 1983 b. Triple quadrupole (Q), wherein the second quadrupole is used as an RF-only collision cell (QqQ). See for example Hunt D F, Buko A M, Ballard J M, Shabanowitz J, and Giordani A B; Biomedical Mass Spectrometry, 8 (9) (1981) 397-408.

c. Q-TOF (a quadrupole analyzer followed by a TOF analyzer). See for example H. R. Morris, T. Paxton, A. Dell, J. Langhorne, M. Berg, R. S. Bordoli, J. Hoyes and R. H. Bateman; Rapid Comm. in Mass Spectrom; 10 (1996) 889-896; and I. Chernushevich and B. Thomson; U.S. patent Ser. No. 30159 of 2002.

d. TOF-TOF (two sequential TOF analyzers with a collisional cell in between). See for example T. J. Cornish and R. J. Cotter, U.S. Pat. No. 5,464,985 (1995)

2. Sequential in time: ion traps such as Paul trap (see for example R. E. March and R. J. Hughes; Quadrupole Storage Mass Spectrometry, John Wiley, Chichester, 1989), Fourier Transform Ion Cyclotron Resonance (FT ICR—see for example A. G. Marshall and F. R. Verdum; Fourier transforms in NMR, Optical and Mass Spectrometry, Elsevier, Amsterdam, 1990) radial-ejection linear trap mass spectrometer (LTMS—see for example M. E. Bier and J. E. Syka; U.S. Pat. No. 5,420,425), and axial-ejection linear trap mass spectrometer (see, for example, J. Hager U.S. Pat. No. 6,177,688).

3. Sequential in time and space:

a. 3D-TOF (See for example S. M. Michael, M. Chen and D. M. Lubman; Rev. Sci. Instrum. 63(10)(1992) 4277-4284 and E. Kawato, published as PCT/WO99/39368).

b. LT/FT-ICR (See for example M. E. Belov, E. N. Nikolaev, A. G. Anderson et al.; Anal Chem., 73 (2001) 253, and J. E. P. Syka, D. L. Bai, et al. Proc. 49th ASMS Conf. Mass Spectrom., Chicago, Ill., 2001).

c. LT/TOF (e.g., Analytica LT-TOF as in C. M. Whitehouse, T. Dresch and B. Andrien, U.S. Pat. No. 6,011, 259) or Quadrupole-trap/TOF (J. W. Hager, U.S. Pat. No. 6,504,148).

A number of non-sequential mass spectrometers suitable for tandem mass spectrometry have also been described (see for example J. T. Stults, C. G. Enke and J. F. Holland; Anal Chem., 55 (1983) 1323-1330 and R. Reinhold and A. V. Verentchikov; U.S. Pat. No. 6,483,109).

For example, U.S. Pat. No. 6,504,148 by J. W. Hager discloses a tandem mass spectrometer comprising a linear ion trap mass spectrometer, a trapping collision cell for ion fragmentation arranged axially, followed by a TOF mass analyzer.

PCT/WO01/15201 discloses a mass spectrometer comprising two or more ion traps and, optionally, a TOF mass analyzer, all arranged axially. The ion traps may function as collision cells and so the spectrometer is capable of MS/MS and $MS^n$ experiments.

Both of these spectrometers are standard in that they rely on axial ejection of ions from the ion trap to the collision cell and onwards to the time of flight analyzer. Both spectrometers also suffer from a problem that there is a conflict between speed of analysis (i.e. number of MS/MS experiments per second) and space charge effects. To ensure sufficient numbers of fragmented ions are detected by the TOF mass analyzer to give sound experimental data, ever-increasing ion abundances must be stored upstream (particularly where more than one precursor ion is to be fragmented and analyzed). The need for high ion abundances upstream in the first analyzer is in conflict with the fact that the greater the ion abundance, the worse the resolution and accuracy of this analyzer because of space charge effects. For emerging high-throughput applications such as proteomics, it is important to provide unattainable yet speeds of analysis, on the order of hundreds of MS/MS spectra per second (as opposed to present limit of 5-15). This in its turn requires both efficient, space-charge tolerant utilisation of all incoming ions and fast, on the order of ms, analysis of each individual precursor m/z. Though time of flight analyzers on their own allow such speeds of analysis, all preceding parts of the system, namely ion trap and collision cell, should also match this so far unresolved challenge.

SUMMARY OF THE INVENTION

Against this background and from a first aspect, the present invention resides in a method of tandem mass spectrometry using a mass spectrometer comprising an ion source, an ion trap with a plurality of elongate electrodes, a collision cell and a time of flight analyzer, the method comprising trapping ions introduced from the ion source and exciting trapped ions thereby to eject trapped ions substantially orthogonally with respect to the direction of elongation of the electrodes such that the ejected ions travel to the collision cell; fragmenting ions introduced from the ion trap in the collision cell; ejecting fragmented ions from the collision cell such that they travel to the time of flight analyzer; and operating the time of flight mass analyzer to obtain a mass spectrum of ions therein.

Ejecting ions from the ion trap, that may be a linear ion trap, substantially orthogonally is a marked departure from the widely accepted norm of axial ejection for tandem analyzer configurations. The concept of orthogonal ejection has long been implicitly considered far inferior to axial ejection because ions ejected orthogonally have normally far greater beam size than their axial counterparts. This would thus require an innovative apparatus for capturing ions, fragmenting them and delivering to time of flight analyzer. A further disadvantage is the higher energy spread of resulting ion beams.

However, the Applicant has realised that far greater performance can be achieved using orthogonal ejection and this benefit can outweigh the disadvantage of large beam size and high-energy ejection. In particular, orthogonal ejection allows typically much higher ejection efficiencies, much higher scan rates, better control over ion population as well as higher space charge capacity. Moreover, the potential problem of the higher ejection energies may be mitigated by sending the ejected ions to the gas-filled collision cell where they will lose energy in the collisions that may lead to fragmentation.

By collision cell, we mean any volume used for fragmentation of ions. The collision cell may contain gas, electrons or photons for this purpose.

Preferably, the trapped ions are ejected as a ribbon beam from a linear ion trap into the collision cell. This allows an increase in the space charge capacity of the ion trap without compromising its performance or speed or efficiency of ejection. The collision cell preferably has a planar design to accommodate the ribbon beam. For example, the collision cell may be designed so that the guiding field it produces starts as essentially planar and then preferably focuses ions into a smaller aperture.

In a preferred embodiment, the collision cell comprises a plurality of elongate, composite rod electrodes having at least two parts, the method comprising applying an RF potential to both parts of each rod and applying a different DC potential to each part of each rod.

It should be noted that the plurality need not be all the rods within the collision cell. Moreover, the same or a different RF potential may be placed, and the same or a different DC potential may be placed on corresponding parts of the rods across the plurality. The method may also comprise applying a DC potential to a pair of electrodes that sandwich the composite rods.

In other embodiments, the collision cell comprises a set of electrodes with only DC voltages applied to them in order to provide an extracting field converging ions towards the exit aperture from the collision cell.

Preferably, the method comprises operating an ion detector located in or adjacent the ion trap to obtain a mass spectrum of the trapped ions. This may comprise operating the ion detector to obtain a mass spectrum of precursor ions trapped in the trapping region and operating the time of flight mass analyzer to obtain a mass spectrum of the fragmented ions, wherein the scans form a MS/MS experiment.

The ion detector is optionally positioned adjacent the ion trap thereby to intercept a portion of the ions being ejected substantially orthogonally. Conveniently, the ion detector and the collision cell may be positioned on opposing sides of the ion trap. Preferably, the method comprises introducing ions generated by an ion source having a relatively broad range of m/z (where m stands for the ion mass and z is the number of elementary charges, e, carried by the ion) values into the ion trap; trapping ions across substantially all the relatively broad range introduced from the ion source and ejecting ions within a relatively narrow range of m/z values substantially orthogonally.

In a currently preferred embodiment, the relatively broad range of m/z values is of the order of 200 Th to 2000 Th, or may alternatively be 400 to 4000 Th (Th: Thompson=1 amu/unit charge).

Optionally, the method comprises ejecting ions within a relatively narrow range of m/z values substantially orthogonally from the ion trap (second trapping region) whilst retaining other ions in the ion trap (second trapping region) for subsequent analysis and/or fragmentation.

Retaining ions of other m/z ranges in the ion trap while the relatively narrow m/z range is being ejected is advantageous as it allows the method optionally to comprise ejection, fragmentation and analysis of ions from the other relatively narrow m/z ranges without further filling of the second trapping region.

This may be useful as mass spectra of fragment ions from two or more different precursor ions may be collected rapidly, i.e. the method may optionally further comprise sequentially introducing fragment ions from the other narrow precursor ion m/z ranges into the time of flight mass analyzer and operating the time of flight mass analyzer to obtain a mass spectrum of the fragment ions associated with each precursor ion m/z range. Subsequent further layers of fragmentation and analysis may be preferred, e.g. to provide mass spectra for all precursor peaks.

The advantages gained with retaining ions whilst others are ejected may also be enjoyed with respect to the first trapping region of the composite ion trap. Hence, the method may further comprise retaining other ions not within the intermediate range of m/z values in the first trapping region when ejecting ions within the intermediate range. Preferably, substantially all ions not within the intermediate range of m/z values are retained.

Other optional features are defined in the appended claims.

From a second aspect, the present invention resides in a method of tandem mass spectrometry using a mass spectrometer comprising an ion source, an ion trap, a collision cell and a time of flight analyzer, the method comprising operating the ion source to generate ions having a relatively broad range of m/z values; introducing ions generated by the ion source into the ion trap; operating the ion trap to trap ions introduced from the ion source and to eject ions within a relatively narrow range of m/z values such that they are introduced into the collision cell whilst retaining other ions in the ion trap for subsequent analysis and/or fragmentation; operating the collision cell such that ions introduced from the ion trap are fragmented; introducing fragment ions from the collision cell into the time of flight analyzer; and operating the time of flight analyzer to obtain a mass spectrum of the fragmented ions.

From a third aspect, the present invention resides in a method of tandem mass spectrometry using a mass spectrometer comprising an ion source, a first trapping region, a second trapping region comprising a plurality of elongate electrodes, a collision cell, an ion detector and a time of flight analyzer. The method comprises a filling stage comprising operating the ion source to generate ions, introducing ions generated by the ion source into the first trapping region, and operating the first trapping region to trap a primary set of precursor ions introduced from the ion source, the primary set of precursor ions having a relatively large range of m/z values.

The method further comprises a first selection/analysis stage comprising operating the first trapping region to eject a first secondary subset of the primary set of precursor ions, the first secondary set of precursor ions having an intermediate range of m/z values, thereby to travel to the second trapping region while retaining other ions from the primary set of precursor ions in the first trapping region, operating the second trapping region to trap ions from the first secondary subset of precursor ions introduced from the first trapping region, operating the ion detector to obtain a mass spectrum of trapped ions from the first secondary subset of precursor ions, and performing a plurality of fragmentation/analysis stages of trapped ions from the first secondary subset of precursor ions.

The method further comprises a second selection/analysis stage comprising operating the first trapping region to eject a second secondary subset of the primary set of the precursor ions, the second secondary subset of precursor ions having a different intermediate range of m/z values, thereby to travel to the second trapping region, operating the second trapping region to trap ions from the second secondary subset of precursor ions introduced from the first trapping region, operating the TOF analyzer to obtain a mass spectrum of trapped ions from the second secondary subset of precursor ions, and performing a plurality of fragmentation/analysis stages of trapped ions from the second secondary subset of precursor ions.

Each of the respective plurality of fragmentation/analysis stages comprises operating the second trapping region to eject a tertiary subset of precursor ions with a relatively narrow range of m/z values substantially orthogonally with respect to the direction of elongation of the electrodes such that they are introduced into the collision cell, operating the collision cell such that ions from the tertiary subset of precursor ions ejected from the second trapping region are fragmented, introducing fragmented ions from the collision cell into the time of flight analyzer, and operating the time of flight mass analyzer to obtain a mass spectrum of the fragmented ions, wherein the tertiary subsets of precursor ions for each of the secondary subsets have different relatively narrow ranges of m/z values.

Clearly, the terms ‘primary’, ‘secondary’ and ‘tertiary’ refer to a structured hierarchy of precursor ions, i.e. each level refers to increasingly narrow ranges of m/z values, rather than successive stages of fragmentation. As such, fragmentation is only performed on tertiary sets of precursor ions.

This arrangement is advantageous as it allows MS/MS experiments to be performed rapidly as only one fill from the ion source is required. Moreover, dividing the precursor ions into increasingly narrow ranges of m/z values allows the ion capacity of the trapping regions and collision cell to be optimised within their space charge limits.

The method may contain three or more selection/analysis stages. Not all selection/analysis stages need include a plurality or indeed any fragmentation/analysis stages. For example, the mass spectrum obtained for a particular secondary subset of precursor ions may reveal only one or no peaks of interest, thereby removing the desire to fragment.

The tertiary subsets of precursor ions may be ejected from the second trapping region as pulses with temporal widths not exceeding 10 ms. Preferably, the temporal width does not exceed 5 ms, more preferably 2 ms, still more preferably 1 ms and most preferably 0.5 ms. Moreover, the fragmented ions may be ejected as pulses with temporal widths not exceeding 10 ms. Ever increasingly preferred maximum temporal widths of the pulses of fragmented ions are 5 ms, 2 ms, 1 ms and 0.5 ms. The pulses may push fragmentations directly into the time of flight mass analyzer from an exit segment of the collision cell. This paragraph also applies to the method using a single ion trap rather than the dual trapping regions.

However many tertiary subsets are chosen for a particular secondary subset, the associated relatively narrow ranges may be chosen to span the associated intermediate range of m/z values. These relatively narrow ranges may be implemented consecutively to step through the intermediate range. The mass spectrum required for each relatively narrow range may be stored and processed separately from the corresponding mass spectra. Suitable widths of the relatively narrow ranges may be determined by reference to a pre-scan, i.e. a mass spectrum or spectra previously acquired by the ion detector or time of flight mass analyzer that will contain peaks of interest. The subsequent mass spectra collected for fragments may be set to correspond to widths including one or more of these peaks. The operation of the mass spectrometer may also be tailored for each tertiary subset of precursor ions and the corresponding fragmented ions, i.e. operation of the second trapping region, collision cell and time of flight mass analyzer may be set specifically for the current relatively narrow range of m/z values. Again this paragraph may also apply to the method using a single ion trap rather than dual trapping regions.

From a fourth aspect, the present invention resides in a tandem mass spectrometer comprising an ion source, an ion trap, a collision cell and a time of flight mass analyzer, wherein the ion trap comprises plurality of elongate electrodes operable to provide a trapping field to trap ions introduced from the ion source and to excite trapped ions such that the excited ions are ejected from the ion trap substantially orthogonally to the direction of elongation of the electrodes; the collision cell is operable to accept ions ejected from the ion trap substantially orthogonally and to fragment accepted ions; and the time of flight mass analyzer is operable to acquire a mass spectrum of the fragmented ions.

The tandem mass spectrometer may further comprise an ion detector located adjacent to the ion trap and operative to detect ions ejected substantially orthogonally therefrom. The ion detector and the time of flight mass analyzer may be positioned on opposing sides of the ion trap.

Preferably, the collision cell is of a planar design.

From a fifth aspect, the present invention resides in a composite ion trap comprising first and second ion storage volumes being arranged substantially co-axially, the common axis defining an ion path through the first ion storage volume and into the second ion storage volume, the first ion storage volume being defined by an entrance electrode at one end and by a common electrode at the other end, the entrance electrode and the common electrode being operable to provide a trapping field for trapping ions in the first ion storage volume, the first ion storage volume further comprising one or more electrodes operable to excite trapped ions within a first m/z range such that the excited ions are ejected axially along the ion path into the second ion storage volume, the second ion storage volume being defined by the common electrode at one end and a further electrode at the other end, the common electrode and the further electrode being operable to provide a trapping field for trapping ions in the second ion storage volume, the second ion storage volume further comprising a plurality of elongate electrodes operable to excite trapped ions within a second m/z range such that the excited ions are ejected from the second ion storage volume substantially orthogonally to the direction of elongation through an exit aperture.

Preferably, the exit aperture is elongated in the same direction as the electrodes.

The person skilled in the art will appreciate that many of the advantages described with respect to the first and second aspects of the invention apply equally well to the composite ion trap, mass spectrometer and tandem mass spectrometers described above.

This invention may provide methods and apparatus implementing techniques for obtaining tandem mass spectrometry data for multiple parent ions in a single scan. In some embodiments, the invention features hybrid linear trap/time of flight mass spectrometers and methods of using such hybrid mass spectrometers. The hybrid mass spectrometers may include a linear trap, a collision cell/ion guide positioned to receive ions that are radially ejected from the linear trap, and a time-of-flight mass analyzer. In operation, ions may be accumulated in the linear trap, and may be ejected/extracted orthogonally such that at least a portion of the accumulated ions enter the collision cell, where they may undergo collisions with a target gas or gases. Resulting ions may exit the collision cell and may be transmitted to the time-of-flight mass analyzer for analysis. The hybrid mass spectrometers may be configured such that a full fragment spectrum can be acquired for each precursor ion even when scanning over the full mass range of the linear trap. This may be achieved by proper matching of time scales of TOF analysis and LTMS analysis as well as by orthogonal ejection of ions from the linear trap.

In some embodiments, the TOF mass analyzer may be of a type that has "multi-channel advantage" as well as sufficient dynamic range and acquisition speed. It is highly desirable the experiment to be done on a time scale appropriate to chromatography and, in particular, liquid chromatography. This means that acquisition of data defining a large area of the MS/MS data space can be acquired on the time scale on the order of <1-2 seconds, while each MS/MS spectrum might be limited by 1-2 ms time-frame.

The details of one or more embodiments of the invention are set forth in the accompanying drawings and the description below. Unless otherwise defined, all technical and scientific terms used herein have the meaning commonly understood by one of ordinary skill in the art to which this invention belongs. All publications, patent applications, patents, and other references mentioned herein are incorporated by reference in their entirety. In case of conflict, the present specification, including definitions, will control. Other features, objects, and advantages of the invention will be apparent from the description and drawings.

DESCRIPTION OF PREFERRED EMBODIMENTS

Figure 1:
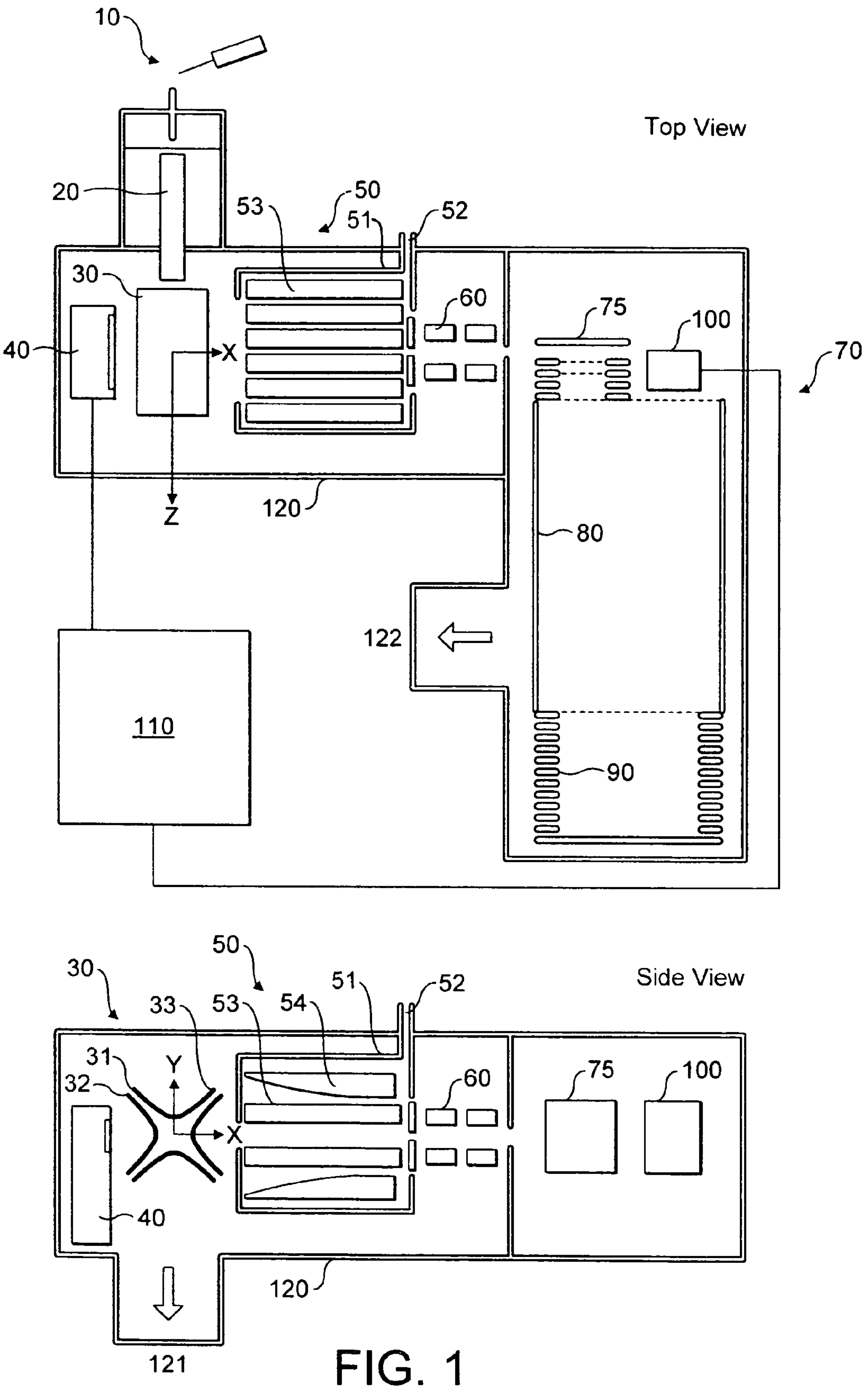
FIG. 1 is a top view and a side view of a mass spectrometer according to an embodiment of the present invention.

One embodiment of a LTMS/TOF hybrid mass spectrometer according to one aspect of the invention is arranged as shown in FIG. 1. It comprises:

- ion source 10 of any known type (depicted here as an ESI source) with transporting optics 20 that may include any number of selection and transport stages, and may include differential pumping stages (not shown);
- linear trap mass spectrometer (LTMS) 30 with electrodes comprising Y rods 31 and X rods 32 and 33 with slots;
- optional electron multiplier-based ion detector 40 that faces a slot in the rod 32, so that the detector 40 can accept ions ejected radially from linear trap 30 through the slot in rod 32;
- collision cell 50 that faces a slot in the rod 33. The detector 40 and collision cell 50 may face each other and the slots may be of corresponding size and shape. The collision cell 50 contains an envelope 51, a gas line 52, RF rod electrodes 53 and preferably DC field auxiliary electrodes (elements) 54. The gap between LTMS 30 and collision cell 50 needs to be pumped by at least one, and preferably two (not shown for simplicity of drawings), stages of differential pumping. Gas used for filling collision cell 50 could be different from that in LTMS 30, examples including nitrogen, carbon dioxide, argon and any other gases;
- ion beam-shaping lenses 60 located on the exit side of the collision cell 50 to influence ions exiting the collision cell en route to the TOF mass analyzer 70;
- TOF mass analyzer 70, preferably of the orthogonal type, comprising a pusher 75, a flight tube 80 with (optional) ion mirror 90, and an ion detector 100. Accordingly, ions enter the TOF analyzer 70 from the lenses 60 and their direction is changed by the pusher 75 through 90° to travel towards the mirror 90. The mirror 90 reverses the direction of ion travel such that they are directed to the detector 100; and
- data acquisition system 110 acquiring data from detectors 40 and 100.

The spectrometer is enclosed within a vacuum chamber 120 that is evacuated by vacuum pumps indicated at 121 and 122.

One implementation of a method of using a hybrid mass spectrometer as shown in FIG. 1 to obtain tandem mass spectrometry data for multiple parent ions in a single scan will now be described. In operation:

1. Ions are produced by any known ion source 10 (MALDI, ES, field ionisation, EI, CI, etc.) and pass through transporting optics/apparatus 20 to LTMS 30;
2. Ions are accumulated and trapped in the LTMS 30. This may be done in one of two ways.
   a. Preferably, an automatic gain control (AGC) method is employed, as described by J. Schwartz, X. Zhou, M. Bier in U.S. Pat. No. 5,572,022. The multiplier based ion detector 40 can be used as means to measure the number of ions accumulated in a preliminary experiment for a known ion injection time allowing estimation of the rate of accumulation of ions in the linear trap 30 and therefore the optimal ion injection time for the main experiment. Ions are accumulated in the linear trap for some known time and then ejected from the linear trap 30 such that some are incident on the detector 40. Such an arrangement corresponds to that of a "conventional" radial ejection LTMS 30 according to U.S. Pat. No. 5,420,425. In this arrangement, ion ejection can be m/z sequential. This allows for correction of the m/z dependent gain of the detector 40 in the estimation of the ion-injection time need to fill the linear trap 30 with the desired number of ions having a chosen m/z range. Alternatively, the detector 40 can be mounted at the terminal end of the linear trap 30 and the ions can be ejected axially en masse to the detector 40 for detection, estimation and control of the number of ions trapped to in the linear trap 30.
   b. Alternatively, the optimal accumulation time for a given experiment can be estimated based on the total ion current detected in a previous experiment.
3. During the injection of ions into the linear trap 30, auxiliary voltages (broadband waveforms) are applied to the rod electrodes 31-33 to control the m/z range of precursor ions initially stored in the linear trap 30 (in a like manner to how a conventional LTMS 30 is operated);
4. After ion injection, further auxiliary voltages may be applied in order to:
   a. effect better selection of the m/z range or ranges of precursors ions to be analyzed;
   b. select a particular narrow m/z range of precursors so as to select a single ion species (or few ion species) and then excite and fragment (or react) that species to produce fragment or product ions. This procedure may be repeated a number of times (n−2) so as to perform a $MS^n$ experiment ($MS^{n-2}$ MS/MS). These $MS^{n-2}$ stages of isolation and fragmentation are substantially identical to how the first MSn−1 steps are performed with a conventional LTMS during a $MS^n$ experiment; or
   c. otherwise manipulate or extract ions within the linear trap 30.
5. After ion accumulation and manipulation steps, precursor ions are ejected orthogonally such that typically at least half of the ions exit the towards the collision cell/planar ion guide 50. This ejection can be performed in a number of ways:
   a. the trapped ions may be extracted as a group;
   b. ions may be extracted m/z selectively and/or m/z sequentially; and
   c. if ions are extracted m/z selectively or m/z sequentially, it is particularly useful for the ion detector 40 to detect the ions exiting the linear trap 30 in the opposite direction from the collision cell (in effect, the detector 40 will measure typically the other half of the trapped ions). This recorded signal may be used to provide a precursor ion mass spectrum.
6. In contrast to some known trap/TOFMS arrangements (e.g., U.S. Pat. No. 5,763,878 by J. Franzen or US-A-2002/0092980 by M. Park, ions extracted from the linear trap 30 are directed into the collision cell/planar ion guide 50 where they will undergo collisions with target gas molecules provided in the collision cell (typically Nitrogen, Argon, and/or Xenon). Generally these collisions will result in a prompt collision-induced dissociation of these ions, unless special care is taken to ensure the kinetic energy of the ions entering the collision cell/planar ion guide 50 is very low. Such low energies could be useful for providing a precursor ion mass spectrum in TOF, and may be achieved by using low RF voltages (with the parameter q of the Mathieu equation typically <0.05 . . . 0.1). For CID of ions, values q>0.2 . . . 0.5 are preferable.
7. The resulting fragment ions lose kinetic energy in collisions with the target gas. The RF field in the collision cell 50 provides strong focusing of the ion motion about the central plane of the cell 50. Superposed DC fields cause ions to be drawn or dragged along the plane of the cell 50 such that they exit the collision cell 50 as a "focused" or collimated beam. The same action could be also achieved by DC-only configuration that makes the collision cell look analogous to an ion mobility drift tube (see, e.g. D. Clemmer, J. Reilly, WO 98/56029 and WO 00/70335). Unlike the latter, separation of resulting fragments according to ion mobilities is not pursued or enforced—on the contrary, the main objective is the fastest of the order of 0.5-3 ms, transit of ions with minimum spread of drift times though with lowest possible internal and kinetic energies;
8. Ions may exit the collision cell 50 in one of two modes:
   a. ions may be allowed to leave the collision cell 50 as a continuous beam which is modulated in intensity and m/z distribution as the m/z and type of precursor ions ejected from the linear trap 30 is scanned (or stepped). It would be expected that fragments from an individual precursor ion would exit the collision cell 50 within 100-3000 microseconds after the precursor ion entered the collision cell 50; or
   b. the fields (typically DC fields) may be varied dynamically so that fragment ions are accumulated and trapped briefly (10 milliseconds or less) and extracted or released as a concentrated and relatively short pulse of ions (within 100 microseconds or less);
9. Ions exiting the collision cell/planar ion guide 50 traverse to the pusher 75 of the TOF mass analyzer 70 though lenses 60.
10. TOF mass analyzer 70, preferably of the orthogonal type, separates resulting fragments according to their mass-to-charge ratio, determines flight times and records their arrival times and intensities using an analog-to-digital converter. The repetition rate for this experiment should be high enough to represent accurately the changing m/z distribution and intensity of the fragments introduced from the collision cell/planar ion guide 50. In some implementations, the interval between successive TOF "scans" should be in the range of 50-1000 microseconds. If the ions are released from the collision cell 50 in a pulsed mode, then the triggering of the TOF scans can be timed to correspond to when the released fragments will be present in the TOF pusher 75;
11. The resulting data are processed by data acquisition system 110 which converts the raw time intensity data into mass spectral data (mass-intensity). These data can then be transferred to a data storage and analysis computer (not shown) where various mass spectral data analysis and searching tools can be applied to analyze the data.

The hybrid LTMS-TOF mass analyzer of FIG. 1 can be operated in a variety of modes:

1) for all-mass MS/MS, the RF of the LTMS 30 can be scanned continuously with TOF analyzer 70 generating fragment ion spectra for consecutive precursor ion m/z windows;
2) alternatively, also for all-mass MS/MS, the RF of the LTMS 30 can be scanned in steps, with each step corresponding to some suitably narrow precursor m/z window. For each step, a corresponding narrow m/z window of precursor ions (e.g. isotopic cluster) is ejected from the linear trap 30 and fragmented in the planar ion guide and collision cell 50. There are a variety of ways to accomplish this (mini RF ramps and then hold periods, mini frequency sweeps of the resonance ejection voltage, narrow band resonance ejection waveform pulses etc.). The precursor ions enter the planar ion guide/collision cell 50 and fragment. Fragments may be accumulated and trapped adjacent to the back end of the collision cell 50. They are then ejected in a pulse to the pusher 75 of the TOF analyzer 70 and m/z analyzed in a single TOF experiment. With an appropriate resolving power of the TOF analyzer 70, isotopic pattern of all peaks in the mass spectrum will be resolved to allow charge state determination;
3) for top-down sequencing or for all-mass $MS^n$/MS, LTMS 30 can be used for $MS^n$ in the usual way, and then fragment ions produced in the collision cell 50 can be analyzed as above; and
4) for MS-only detection or high-mass accuracy measurements, ions over the full m/z range can be stored in the LTMS 30 using the minimum necessary RF field intensity and then ejected with a weak broad-band dipolar excitation. Then, the kinetic energy of the ejected ions can be made low enough to avoid fragmentation in the collision cell/planar ion guide. An alternative approach to the ejection of ions from the linear trap 30 at low kinetic energies is to superpose a weak DC dipole field oriented in the X dimension (and perhaps superposing a small DC quadrupole field at low RF voltage so that high m/z ions remain stable in the Y dimension) and then very rapidly turn off the RF trapping potentials applied to the rod electrodes 31-33.

Other schemes are also possible. Above all, the instrument could be used for "traditional" ion trap type $MS^n$ experiments as well.

Figure 2:
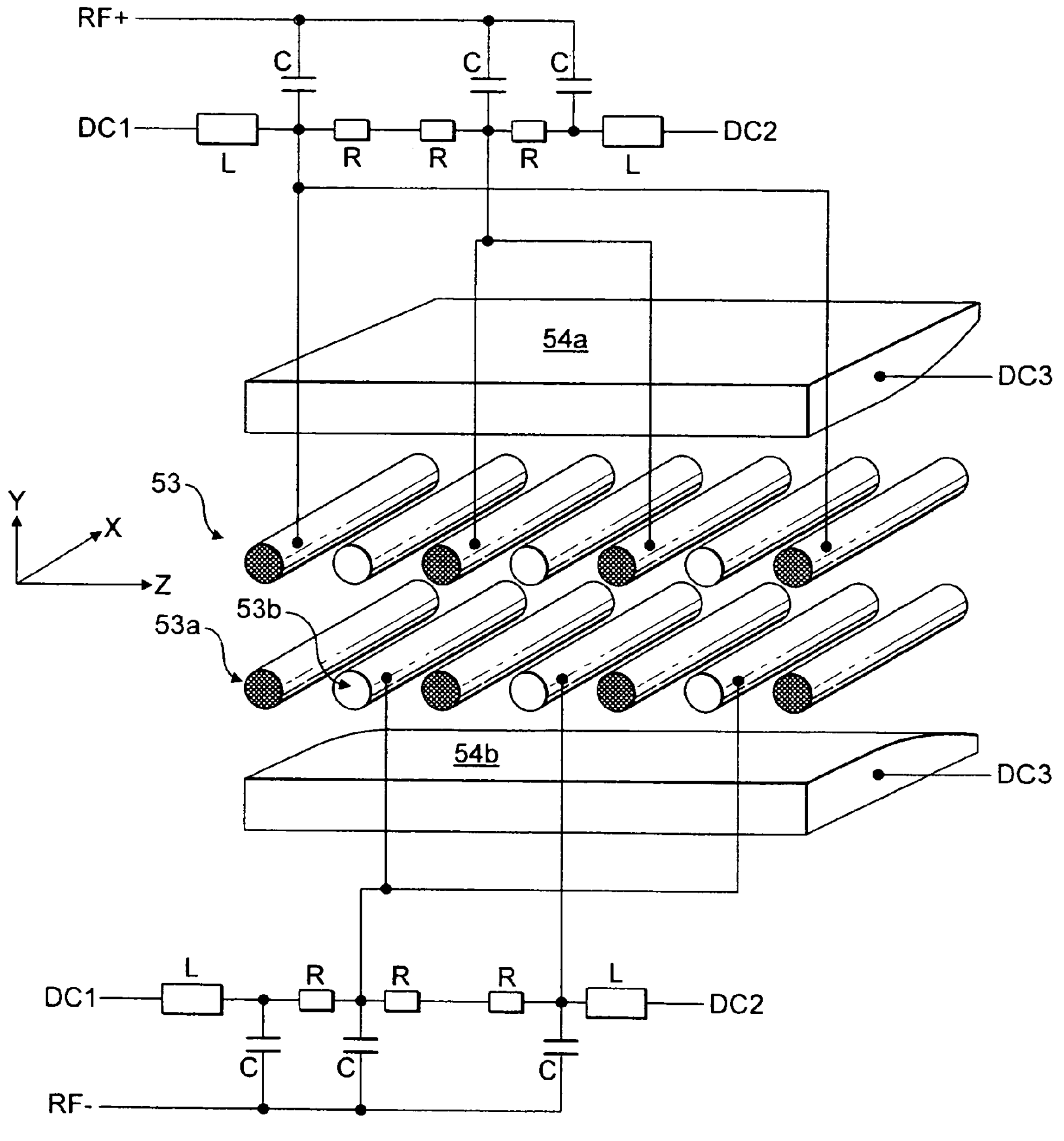
FIG. 2 is a perspective cross-sectional view of part of the collision cell of FIG. 1 with ions entering it along direction X, and shows part of the electrical circuit connected thereto.
Figure 4A:
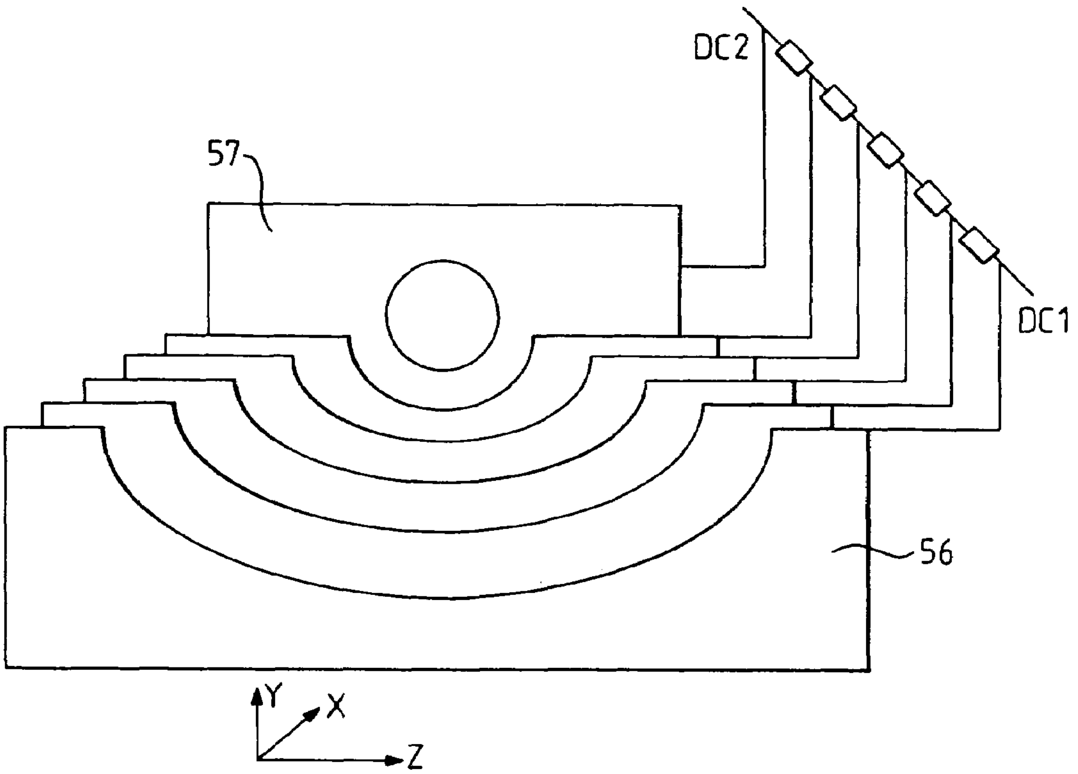
FIG. 4 shows another embodiment of the collision cell, whereas only DC voltages are applied.

Embodiments of the collision cell/planar ion guide 50 will now be described with reference to FIGS. 2, 3 and 4. As the slot in electrode 33 that allows ions ejected from the linear trap 30 to pass to the collision cell 50 is elongated in the Z-direction, a special arrangement of collision cell 50 (as indicated above) is necessary to accept the ribbon like beam of ions emanating from the linear trap 30 and focus it into a tight bunch required by TOFMS. These challenges are much more demanding than those addressed by e.g. EP-A-1,267,387, U.S. Pat. No. 5,847,386, U.S. Pat. No. 6,111,250, U.S. Pat. No. 6,316,768, US-A-2002/0063,209 and others. A planar RF ion guide can be used for this collision cell 50 to provide a RF guiding field having an essentially planar structure. The collision cells 50 shown in FIGS. 1 and 2 are comprised of rod pairs 53*a*, 53*b* with alternating RF phase on them. There is a wide variety of RF planar ion guides that may be constructed. In the ones shown, opposing rod electrodes 53 have the same RF voltage phase. A substantially equivalent ion guide 50 would result if opposing rod electrodes 53 had opposite RF voltages phases (adjacent rod electrodes 53*a*, 53*b* still have opposite phases). The inhomogeneous RF potential constrains the motion of ions about the central plane of the ion guide 50. Superposed DC potentials are used to provide focusing and extraction of the ions within the ion guide 50 such that ions exit as a beam of much smaller cross-section. Trapping of ions in the collision cell 50 may be achieved by providing DC potential barrier at its end. In fact, the collision cell 50 need not trap ions, but could be used to fragment ions as they travel through. The planar RF ion guides 50 with steering DC potential (gradients) may be constructed in many ways. The following illustrates a number of these:

1) the DC offsets on each pair of rods 53*a*, 53*b* are chosen in such a way that a two dimensional potential well is formed acting in the direction normal to the axes of the rod electrodes 53 (the Z dimension in FIG. 2). An optional DC field to draw the ions along the rod electrode may be created by superposing a DC "field sag" onto RF field using field elements 54*a* and 54*b* as described for the axial case in B. A. Thompson and C. L. Joliffe, U.S. Pat. No. 6,111,250, and B. A. Thompson and C. L. Joliffe, U.S. Pat. No. 5,847,386. The strength of this extraction field is dependent on the voltage, shape and position of the elements 54*a* and 54*b*, and the geometry of RF rods 53;
2) field elements 54*a* and 54*b* can be shaped in two dimensions (not shown) in such a way that both the potential well in the Z-direction and the axial field along X are formed due to its associated DC "field sag" inside the ion guide 50. This requires rather high voltages to be applied to the field elements 54*a* and 54*b*;
3) an alternative approach to the one depicted in FIG. 2 is where the rod electrodes 53 are oriented perpendicularly to the direction the ions will be drawn out of the ion guide 50 (along the Z axis as shown in FIG. 3) and the DC potential well to cause focusing is created using "field sag" from field elements 54*a* and 54*b* (FIG. 3). In this approach the extraction field may be created by applying incrementally different DC offsets on each adjacent rod electrode 53;
4) for a fly-through arrangement, a gas-filled DC-only collision cell could be used. DC voltages on entrance electrode 56 and field electrodes 57 are chosen in such a way that a retarding force directs ions towards the central axis of the collision cell. Such forces are created by fields with positive curvature in the direction orthogonal along the axis and, according to Laplace equation for electrostatic fields, negative curvature along the axis. For example, such a field is created by the potential distribution of the type:

$$U(x, y, z) = k \cdot \left(-x^2 \cdot \left(\frac{1}{Y^2} + \frac{1}{Z^2}\right) + \frac{y^2}{Y^2} + \frac{z^2}{Z^2}\right),$$

wherein k>0 for positive ions, x is the direction of ion ejection from LTMS 30, z is direction along the ejection slot in electrode 33 and y is directed across the slot, 2Y and 2Z are inner dimensions of collision cell electrodes 57 in y and z directions correspondingly (see FIG. 4*a*). To match ribbon-shape entrance beam with preferably circular shape of the output beam, Y and Z could slowly change along the direction x, starting from Z>>Y for the entrance electrode 56 and finishing with Z≈Y at the exit from the collision cell 50. Due to high energy of ejected ions and absence of any requirements on ion mobility separation, ions could be also injected orthogonally into the collision cell 50 as exemplified on FIG. 4*b*. The potential distribution in such cell could be approximated by a similar formula:

$$U(x, y, z) = k \cdot \left(-y^2 \cdot \left(\frac{1}{X^2} + \frac{1}{Z^2}\right) + \frac{x^2}{X^2} + \frac{z^2}{Z^2}\right),$$

wherein 2X is a characteristic dimension commensurate with the height of the collision cell in x direction. It will be understood that numerous other embodiments could be presented, all following the same general idea. For example, some electrodes (e.g., 57*a* on FIG. 4*b*) could be shaped, while others (e.g. 57*b*) could have a tunable voltage applied to them while others (e.g. 57*c,* 57*d,* etc.) could have progressively changing sizes.

Figure 6A:
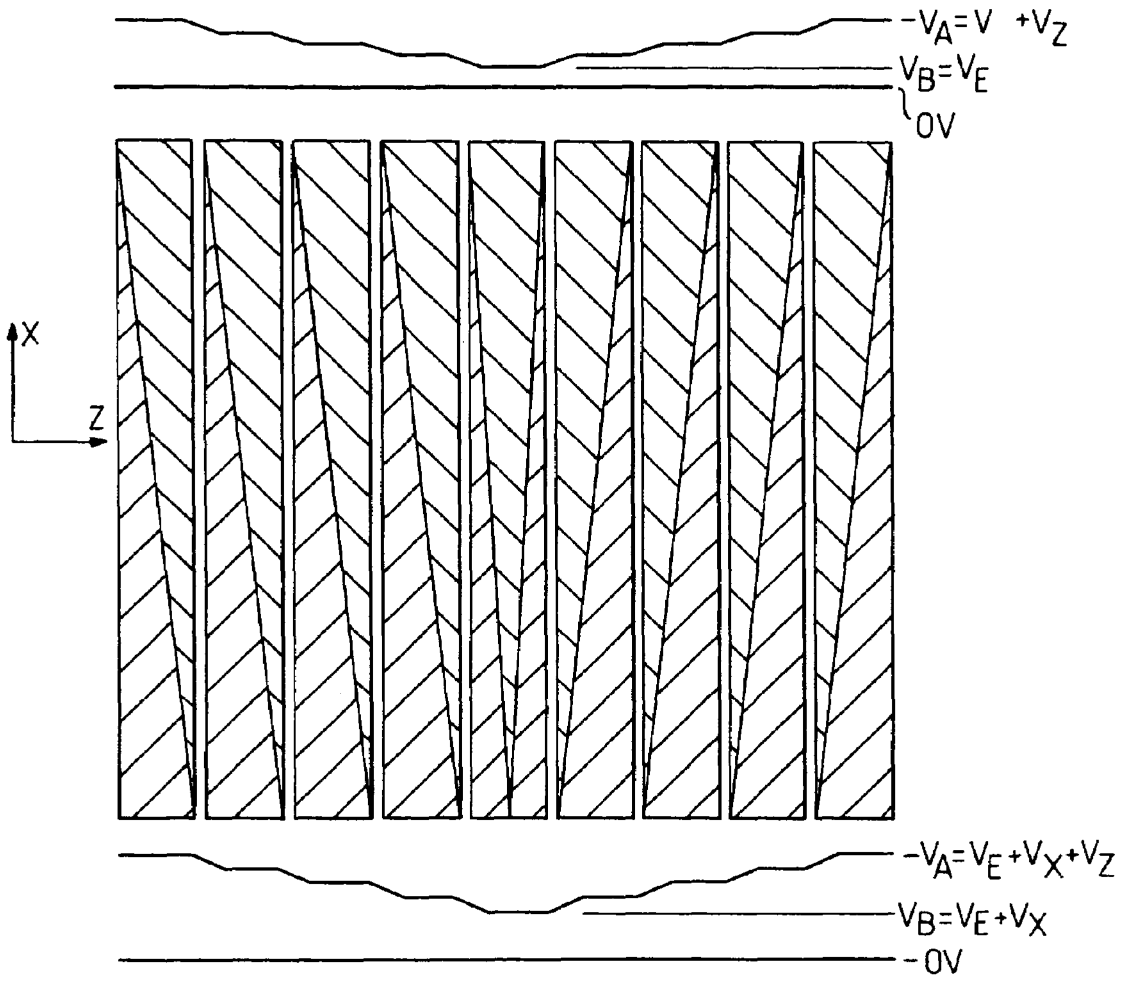
FIG. 6*a* shows an array of electrodes akin to that of FIG. 5*a* and the resulting potentials and FIG. 6*b* adds indications of entrance points and exit points for ions.
Figure 6B:
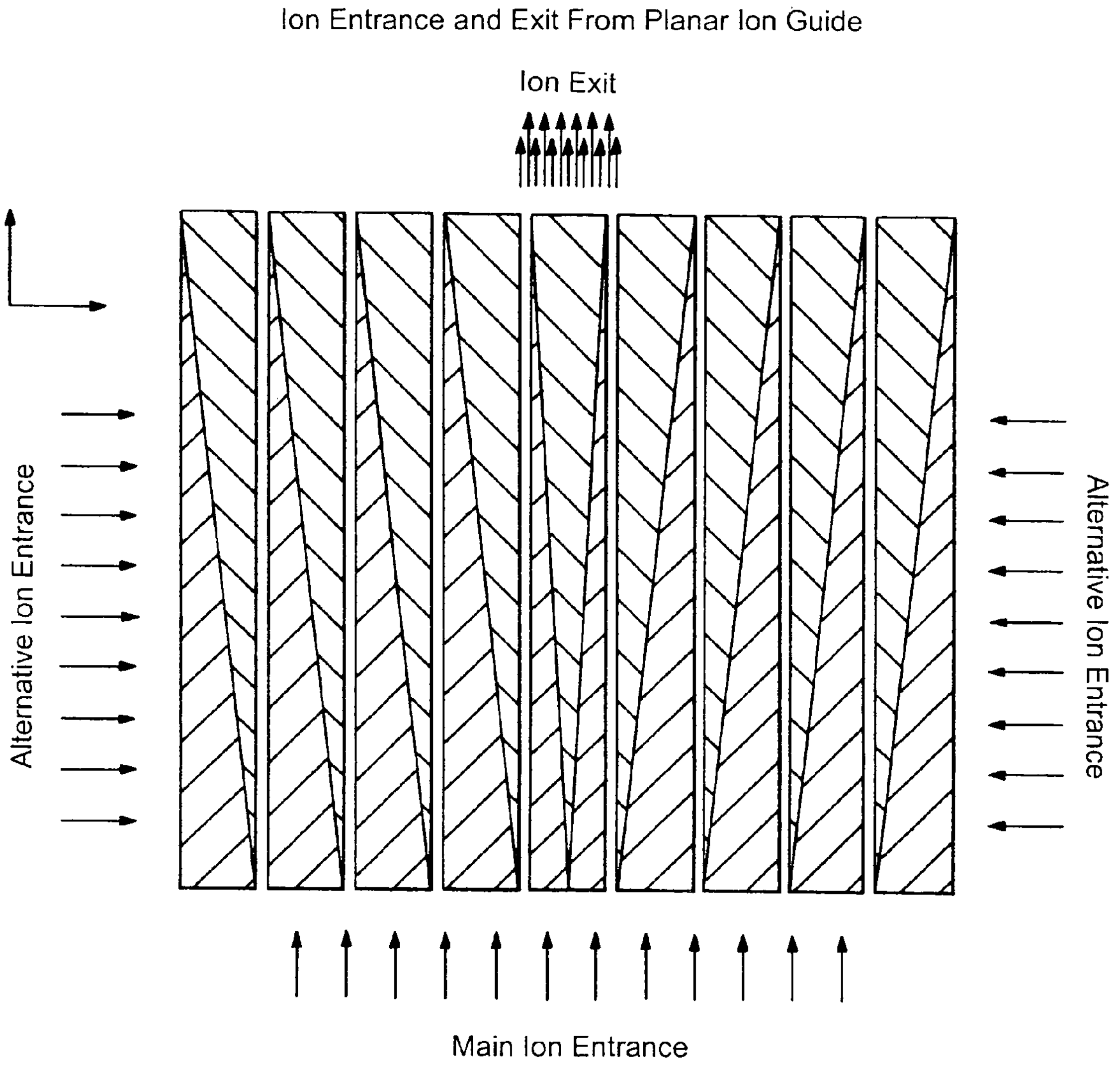
Figure 7:
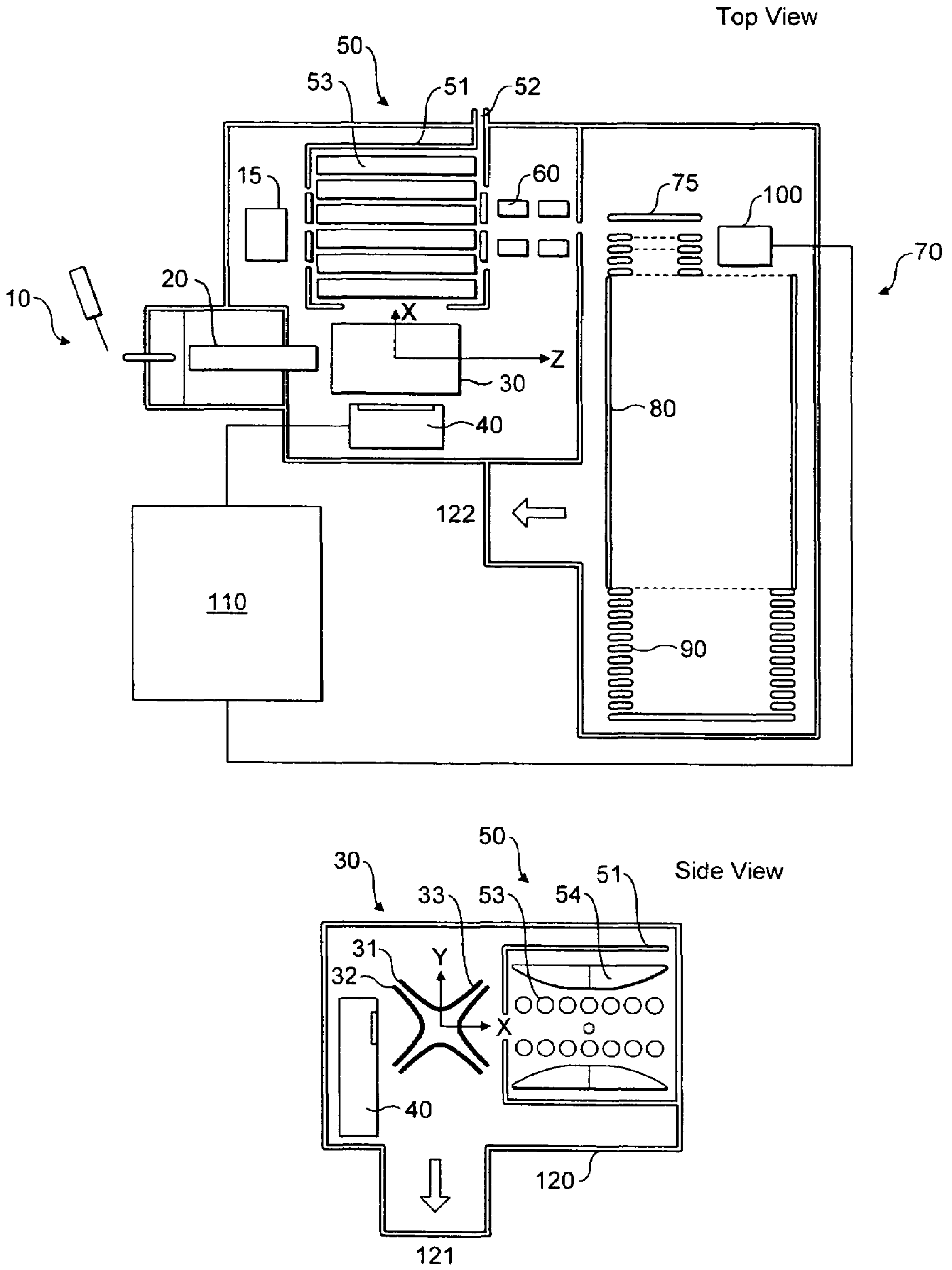
FIG. 7 is a top view and a side view of a mass spectrometer according to a further embodiment of the present invention.

5) in the embodiments based on the use of RF fields, the use of field elements 54 requires relatively high DC voltages to be applied. This can be avoided by using split composite rods such as those shown in FIG. 5. Each rod 53 is divided into tapered sub rods 58 and 59 with slightly different DC voltages but identical RF voltages applied to them, so that smooth DC gradients are formed in the appropriate directions in the vicinity of the central plane of the ion guide 50. This approach was exemplified in A. L. Rockwood, L. J. Davis, J. L. Jones and E. D. Lee in U.S. Pat. No. 6,316,768 to produce an axial DC gradient in an RF quadrupole ion guide. According to the desired direction of the field, rods 53 can be split to impose an approximate linearly varying (dipole) DC potential field (see FIGS. 5*a* and 6*a*) or a DC potential well (see FIGS. 5*b* and 6*b*) along the central plane of the ion guide 50 without altering the RF field throughout the device. While dividing the electrodes 53 in this way will cause relatively significant "steps" or sharp transitions in the DC potential near the electrodes 53, the absolute voltage difference between the electrode sections 58, 59 will be rather small (less than 10 Volt DC is expected). Thus, this lack of smoothness in the DC potential gradient should not be a problem, particularly since the gradient of effective potential associated with the RF voltage applied to the rod electrodes 53 is likely to be relatively much greater in the vicinity of the rod electrodes 53. While shown in the drawings as individual rod assemblies 53, the set of composite rods 53 can be manufactured as a single ceramic circuit board with appropriate cut-outs and through-plating for avoiding HV breakdown or charging of dielectric thus simplifying the manufacture of the ion guide 50; and 6) ions can also be extracted from the RF collision cell/planar ion guide 50 transversely to the direction of their ejection from LTMS 30 and entrance into the collision cell 50, as illustrated in FIG. 7. In this case, the DC potential well in the collision cell oriented such that ions are constrained in the X dimension. A number of strategies can be used to insure that ions are caught in the collision cell 50:

a) the potential well can be made to be asymmetric (i.e. ions enter the field at potential lower than that of the furthest rod: this will ensure their reflection in X-direction regardless of collisions as long as the initial ion kinetic energy is less than the product of this voltage difference and the charge of the ion). The DC field along Z extracts ions towards the TOF analyzer 70; and/or b) a flat plate electrode can be placed at the opposite end of the ion guide 50 from where the ions enter the collision cell planar ion guide 50. If it is located a half-rod gap width from the last rod electrodes, it will correspond to an iso-potential of the RF field and thus maintain the integrity of the RF field to the end of the ion guide 50. If this ion guide 50 is also biased at an appropriate DC voltage, it will reflect ions back toward where the ions entered the ion guide 50.

In any orientation or embodiment of the planar collision cell, collisional damping will cause ions to relax toward the central plane of the device and drift to the exit of the device according to the steering DC potentials. Gas pressure in the planar collision cell is to be chosen in a way similar to that in collision cells of triple quadrupoles and Q-TOFs, typically with a product of pressure and distance of travel in excess of 0.1 . . . 1 torr.mm.

Figure 8:
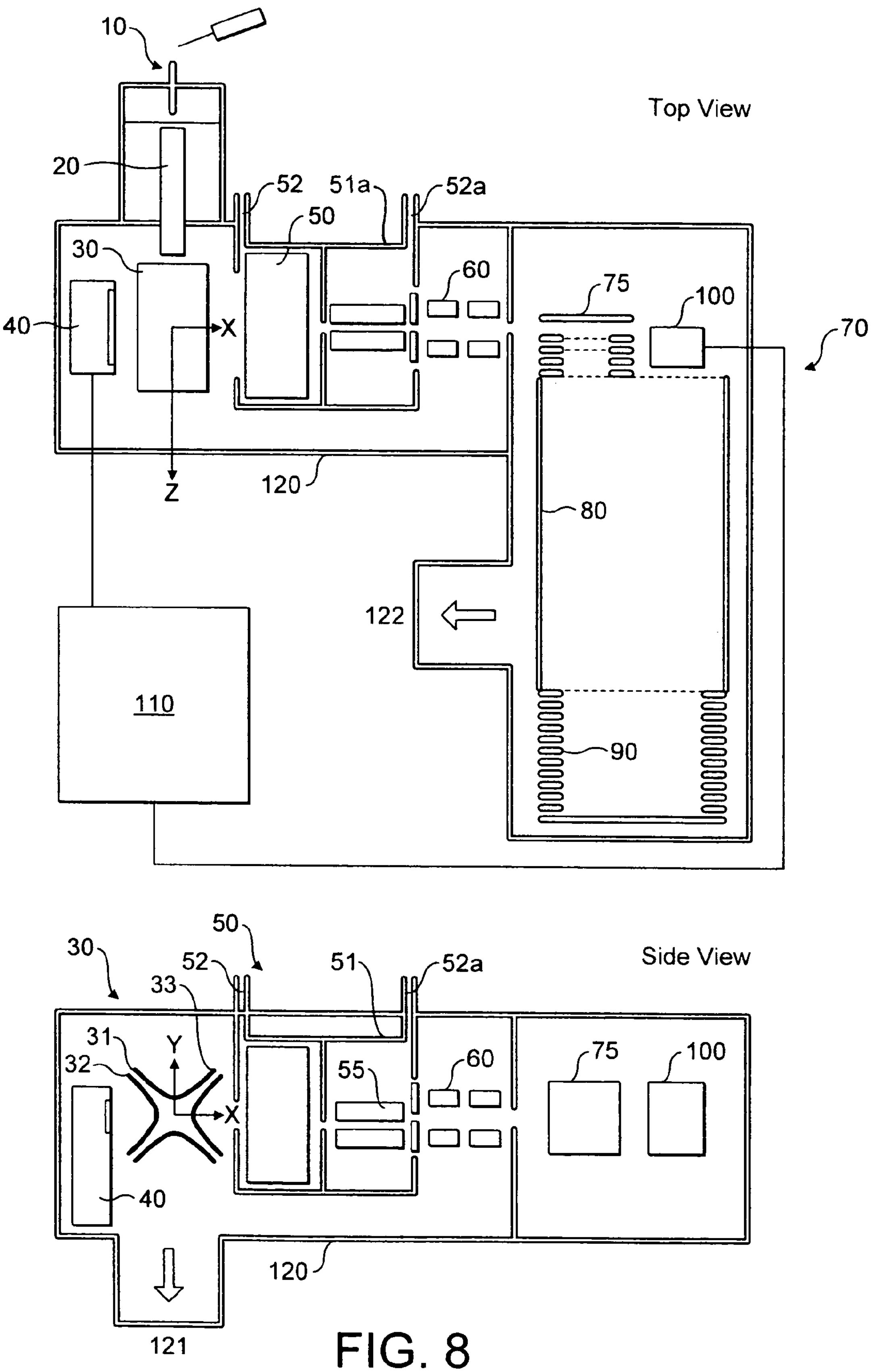
FIG. 8 is a top view and a side view of a mass spectrometer according to a yet further embodiment of the present invention.

It should be noted that the effective potential wells (m/z dependent) established by either the RF or DC field in the ion guide 50 will be rather flat-bottomed. Thus the ion beam will have a fairly large diameter at the exit of the collision cell/planar guide 50 (relative to that which would exit from a RF quadrupole operated similarly at similar gas pressures). An additional RF multipole (e.g. quadrupole) ion guide portion 55 of the collision cell 50 will allow for better radial focusing before extraction in to the TOF analyzer 70 (as shown in FIG. 8). Such an extension of the collision cell 50 can be used also for ion accumulation before pulsed extraction to the pusher 75 of the TOF analyzer 70. A similar segmentation of rod electrodes 53 to those proposed to superpose the steering DC field in the planar portion of the collision cell 50 can be used to draw or trap the ions within the multipole section of the device. Alternatively, ion guide 55 could be made relatively short, with ratio of length to inscribed diameter not exceeding 8. By applying voltages to end caps of ion guide 55, it will ensure fast ion transit due to the axial field created by voltage sag from these end caps. It also may be also desirable to enclose the multipole (quadrupole) portion of the collision cell/ion guide 50 in a separate compartment 51*a,* perhaps with its own gas line 52*a*. This would allow independent control of the pressure in this portion of the collision cell 50 for fast ion extraction to the TOF analyzer 70 and, optionally, optimal trapping.

The collision energy of the precursor ions in the collision cell/ion guide 50 is determined by the kinetic energy of the ions when they exit LTMS 30 and the voltage $V_{acc}$ between LTMS 30 and collision cell/ion guide 50. Depending on the operating parameters for the LTMS 30, precursor ion energies of hundreds of eV's per charge can easily be obtained even for zero $V_{acc}$. However, for better acceptance of precursor ions, it may be preferable to lift (negatively for positive ions) the offset voltage of LTMS 30 after ions are captured inside it. In some embodiments, the amplitude of this "energy lift" is hundreds to thousands of Volts. For high $q_{eject}$ from the linear trap 30, the kinetic energy/unit charge of ejected ions is proportional to m/z, and thus $V_{acc}$ may be programmed to change during the m/z scan of the LTMS 30 to control the collision energy as the m/z of the precursor ions is scanned (or stepped).

An advantageous feature of using a planar ion guide as the collision cell 50 is the capacity of the ion guide to accept ions input to it from different sides. This allows the collision cell 50 also to act as a beam merger. Moreover, it is known that a 2-D quadrupole linear ion trap has a greater ion storage capacity than a 3-D quadrupole ion trap. The slot in the rod 53 allows radial mass-selective ejection of ions for detection, but the slot length is limited by the physical nature of conventional detectors. The planar ion guides 50 described herein may be utilized to facilitate the employment of a longer 2-D quadrupole linear ion trap 30, having a longer than conventional slot, by allowing the ions that are radially ejected along the entire length of the slot to be focussed onto a conventional detector. A longer 2-D quadrupole linear ion trap 30 ultimately provides for still greater ion storage capacity.

In some implementations, a second reference ion source can be used to provide a stable source of ions of known m/z to the planar ion guide. If these reference ions are introduced to the collision cell 50 at sufficiently low kinetic energies, they will not fragment. These reference ions would mix with the beam of ions and their fragmentation products originating in the linear trap 30 and would provide an m/z internal calibrant for each and every TOF spectrum. In this way space charge capacity of the LTMS 30 does not need to be shared with reference ions. This enables more accurate m/z assignments in the production TOF spectra as there are always m/z peaks of precisely known m/z in each spectrum. FIG. 7 shows such a reference ion source 15 coupled to the collision cell/planar ion guide 50. This source 15 can be a relatively simple electron impact ionization source fed continuously with a reference sample. Other simple ionisation sources with relatively stable output would also be appropriate. It should be emphasised that this feature has applicability beyond the instrument described in this disclosure. Internal standards are useful for improving the m/z assignment accuracy of TOF and FT ICR instruments. The ability to either merge or switch between ion beams from multiple ion sources between two stages of mass analysis is also a highly desirable and novel feature in some applications.

Description of the transport characteristics of a RF-only version of the planar ion guide 50 could be based on the general theory of inhomogeneous RF file devices outlined in D. Gerlich, *State-Selected and State-to-State Ion-Molecule Reaction Dynamics, Part* 1: *Experiment,* Ed. C. Ng, M. Baer, Adv. Chem. Phys Series, Vol. 82, John Wiley, Chichester, 1992, pp 1-176. For one particular device modelled, the effective potential well depth is in excess of 5 Volts from m/z 200 to m/z 1000. The "corrugation" (sinusoidal ripple) of the effective potential in the dimension perpendicular to the axes of the rod electrodes 53 increases from ca. 0.065 Volts at m/z 1000 to ca. 0.35 Volts at m/z 200. This means that the superimposed DC field (field sage) must be such that the DC field gradient in the same direction is on the order of 0.5 Volts/a (where a is the center-to-center distance between adjacent rods) or else ions will get "trapped" in the local minima of the effective potential "corrugation" wells.

Figure 3:
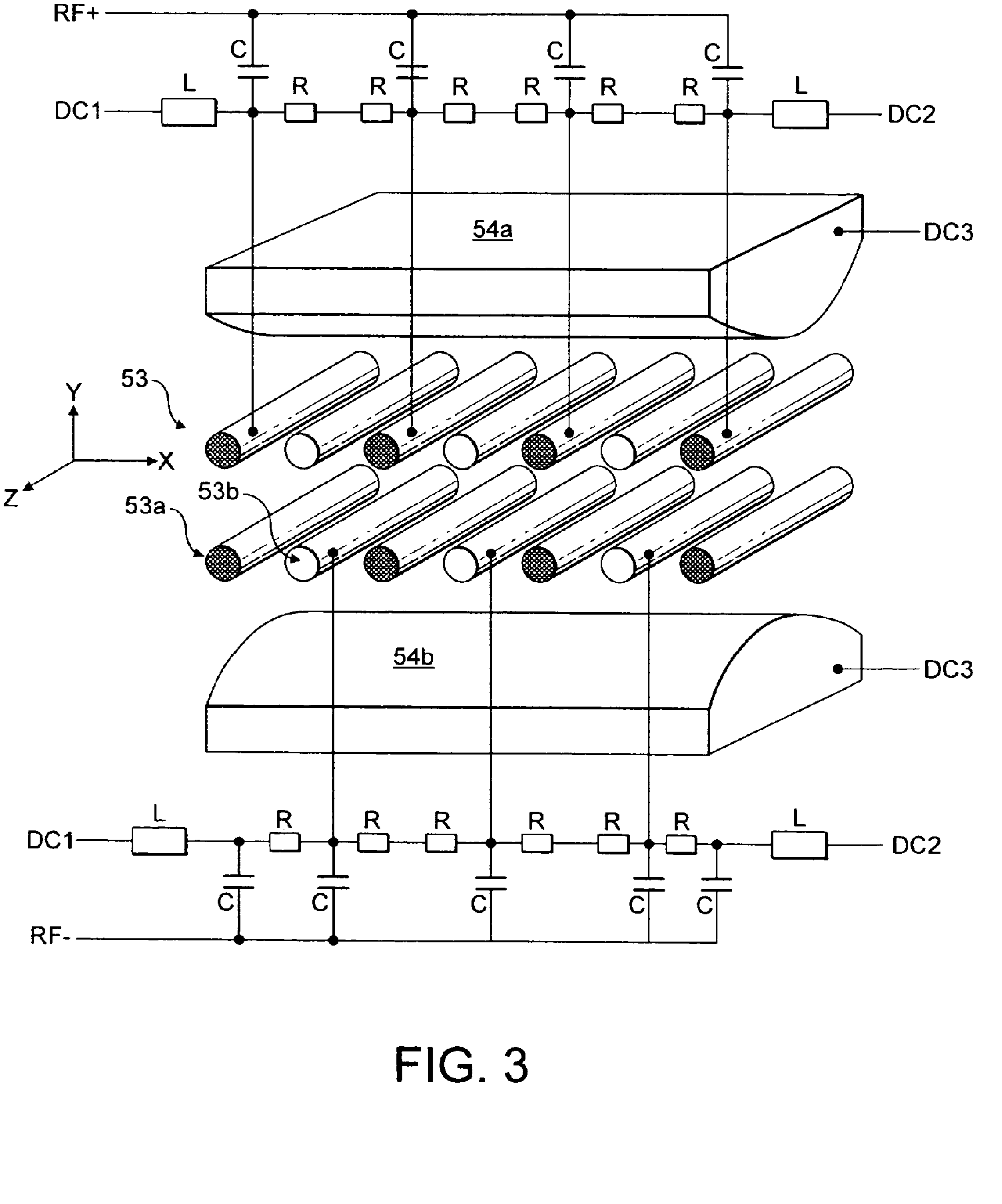
FIG. 3 correspond to FIG. 2, but shows an alternative collision cell.
Figure 4B:
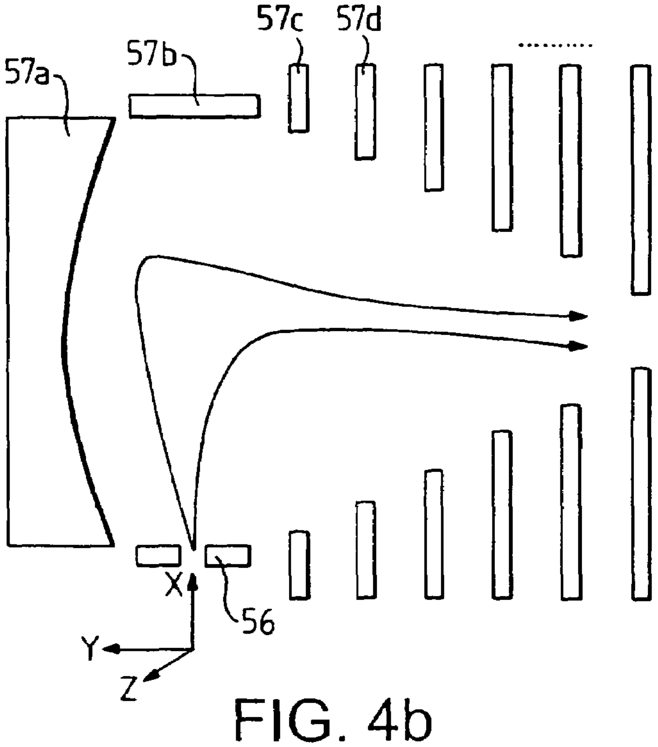
Figure 9:
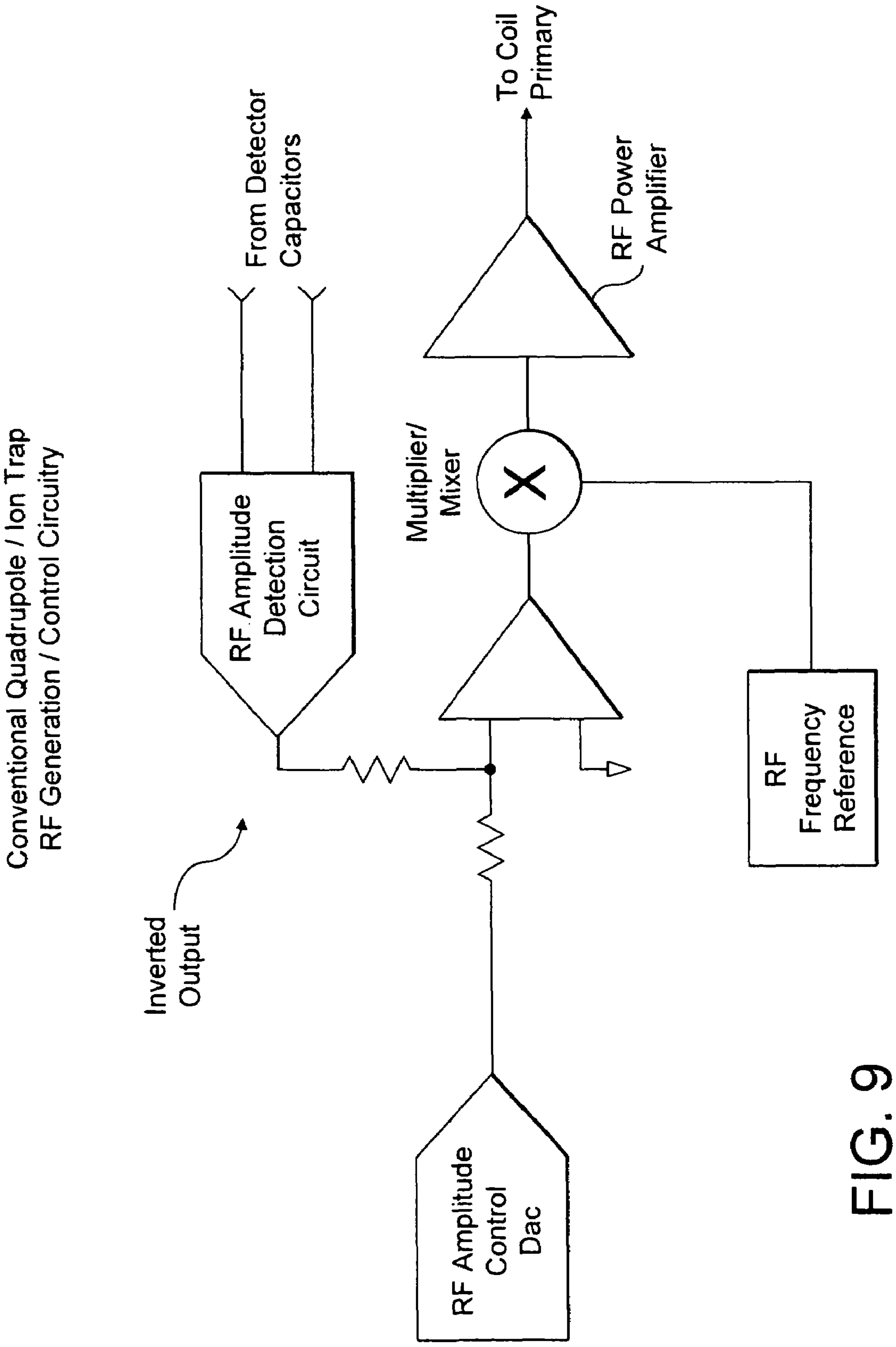
FIG. 9 shows circuitry associated with the ion trap.

In the circuitry shown in FIGS. 2 to 3, the RF voltages are coupled to the rod electrodes 53 that have different DC voltages provided by resistive-divider networks. The RF chokes L provide the RF voltage blocking for the DC voltage supplies driving the ends of the resistive strips. A somewhat more sophisticated approach and one more completely describing the RF voltage source is illustrated in FIGS. 9 to 12. FIG. 9 shows the standard RF generation and control circuitry used for quadrupoles/ion traps and multipole ion guides. A multi-filar RF tuned circuit transformer coil provides both an efficient means to generate high RF voltages as well as providing the DC blocking function of RF chokes used in FIGS. 2 to 3.

Figure 10:
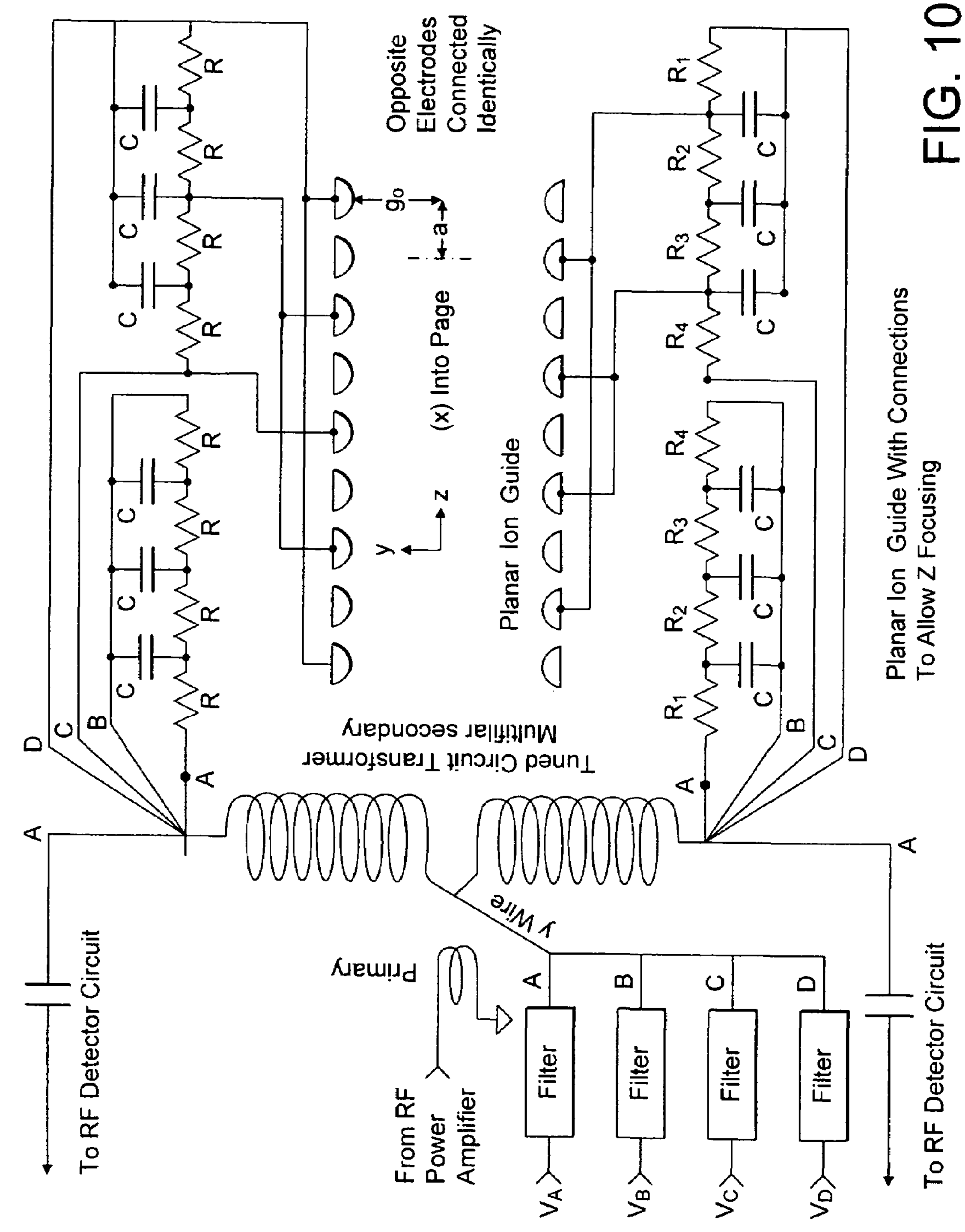
FIG. 10 shows circuitry associated with the collision cell.

FIG. 10 exemplifies the use of a bi-filar transformer coil and resistive divider strips for getting the appropriate superpositions of RF and DC voltage to the rod electrodes of the planer ion guides shown in FIGS. 2 to 3. The RF bypass capacitors (labelled C) are probably needed if the overall resistance of the resistive strip is above 100-1000 ohms. If needed, the bypass capacitances should be on the order of 0.01 nF. The whole RC strip can be put in vacuum and be made intrinsic to the planar ion guide assembly (e.g. a ceramic circuit board connecting to the rod electrodes 53, or a ceramic circuit board containing composite rods on one side and the RC strip on the other). A RF amplifier (ca. 15W) and multi-filar transformer similar to the ones used to drive the multipole ion guides in the LCQ should be sufficient for producing RF voltages up to ca. 500-1000 Volts at ca. 2.5 MHz on such planar ion guides. In general, the RF voltages applied to such planar ion guides would have frequencies in the range from 0.5 to 3 MHz and amplitudes between 300 and 3000 Volts. This scheme should be very useful for RF and DC generation superposition throughout this range of voltages and frequencies.

Figure 5A:
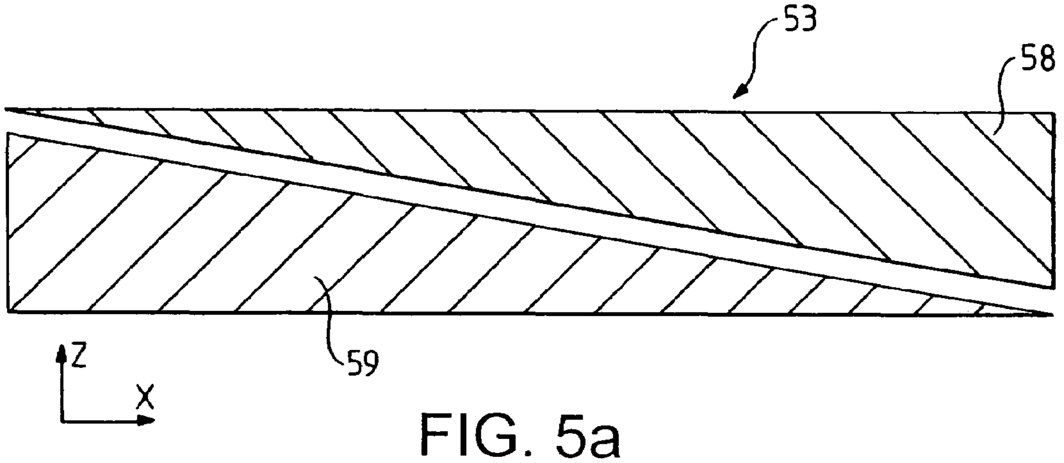
FIG. 5 shows sections of two types of rod electrodes that may be used in the collision cells of FIGS. 2 and 3.
Figure 5B:
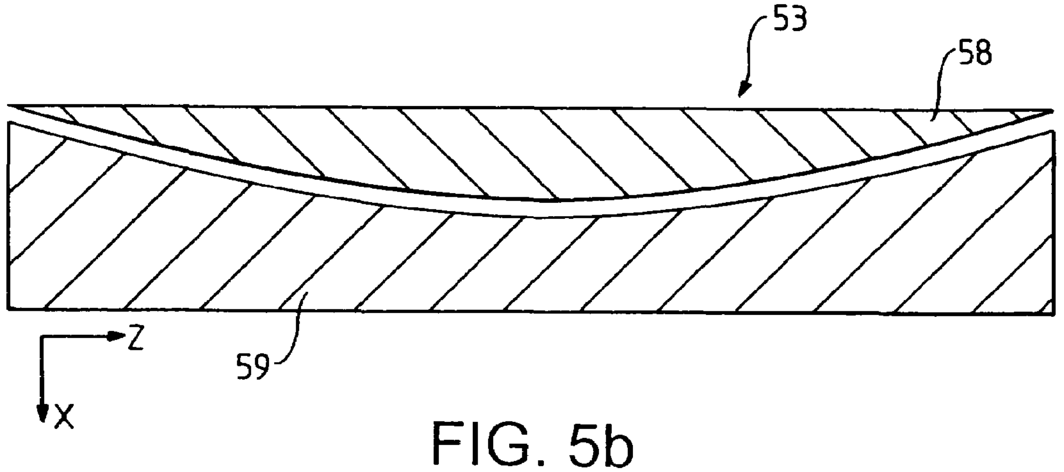
Figure 11:
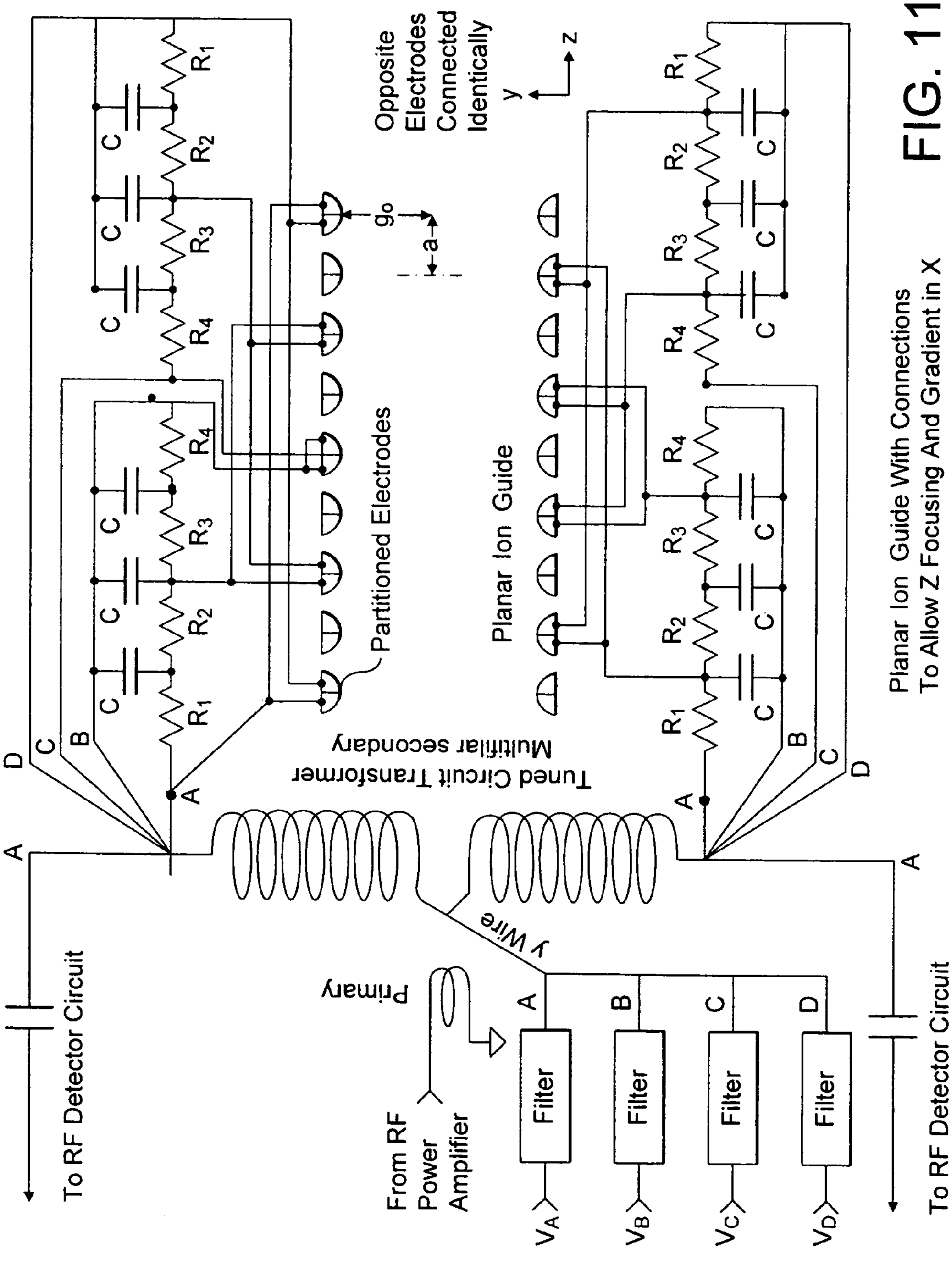
FIG. 11 shows alternative circuitry associated with the collision cell.

FIG. 11 shows a version of the circuitry providing for the extraction field gradient using the composite rods of FIG. 5*a*. This involves an extra pair of filars on the transformer coil and an extra RC voltage divider strip on each end of the coil.

Figure 12:
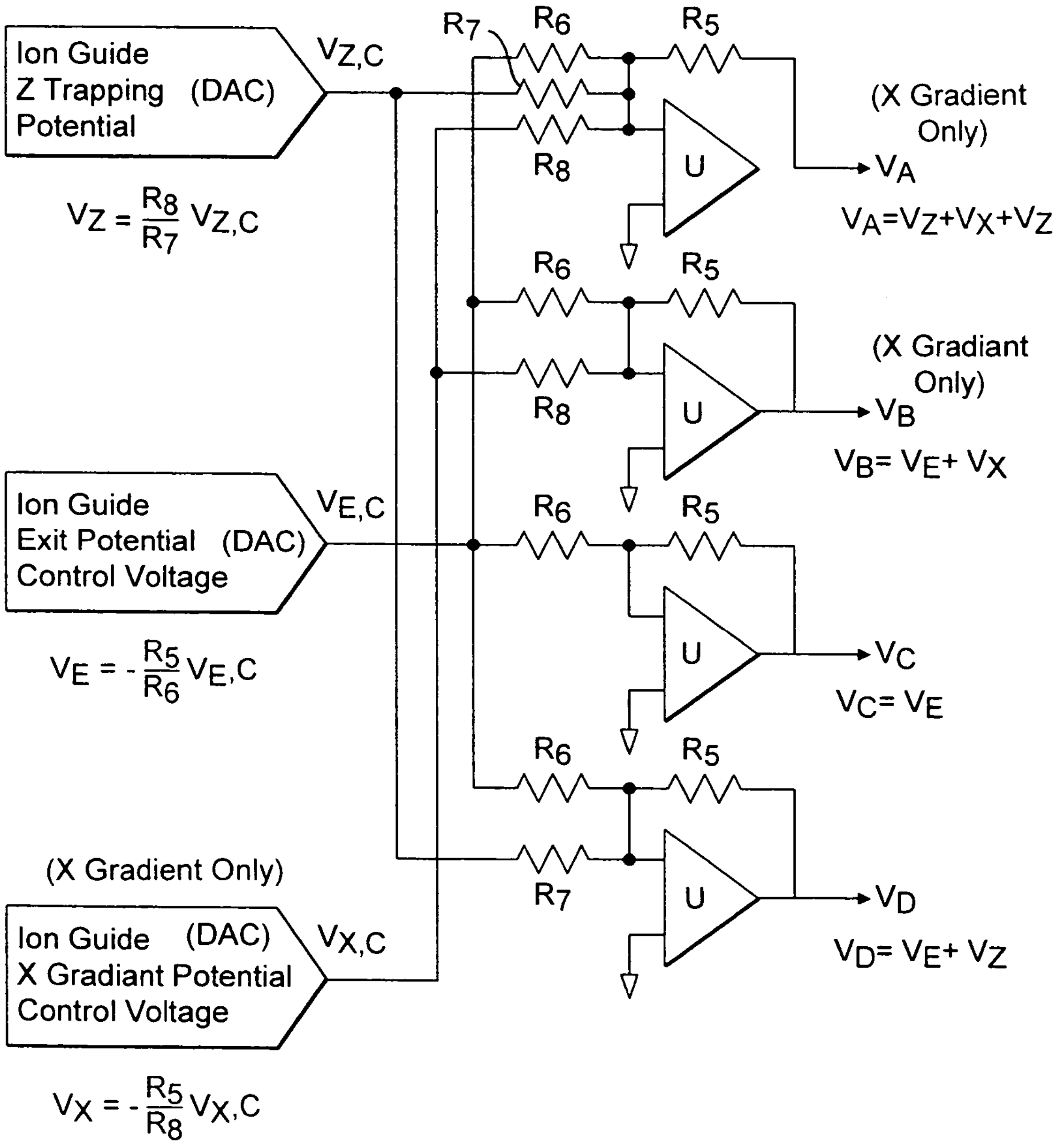
FIG. 12 shows circuitry to create DC voltages for the collision cell.

FIG. 12 shows the circuitry that can be used to generate voltages to be applied to the four filars of the transformer coil to generate the combined focusing and extraction DC field gradients. This particular arrangement would allow independent control of the intensity of the focusing and extraction DC field gradients and the overall bias (voltage offset/exit DC potential) of the device.

In embodiments calling for successive "all mass" MS/MS experiments on a time scale suitable for chromatography, the maximum allowable interval between successive all mass MS/MS experiments should be on the order of about 1-2 seconds. This leads to a maximum precursor m/z scan rate on the order of 0.5-2 Th/msec, depending on how wide a precursor mass range needs to be scanned and how much time is allowed for ion accumulation in the LTMS 30 (this assumes the device is operated in the continuous precursor scanning mode, though the considerations are essentially the same for the stepped mode). A typical time frame for a single TOF experiment/acquisition is 100-200 microseconds. This imposes the lower limit on the required width in time of a precursor m/z peak of ca. 300-1500 microseconds (as would be measured at the exit of the collision cell/ion guide 50). This precursor m/z peak width (in time) is going to be determined by the convolution of the precursor m/z peak width (in time) of ions ejected from the LTMS 30 and the time distribution for associated precursor and fragment ions to transit though the planar ion guide/collision cell 50 (it should be noted that in the continuous precursor scanning mode, it is likely that there will need to be some correction in the precursor m/z calibration to correct for the mean time of flight of precursor ions and associated product ions through the collision cell/ion guide).

This creates some design flexibility as these times may be adjusted depending on various considerations such as:

1. LTMS 30 precursor scan rate (Th/sec) and precursor m/z resolution (peak width in Th)
    a. for higher resolving power of LTMS 30 and higher space charge capacities it is preferable to operate at a higher $q_{eject}$ (e.g., at $q_{eject}$=0.83);
    b. for optimum precursor ion m/z resolution near minimum resonance ejection voltage amplitudes are used;

c. if one is willing to sacrifice resolution of precursor ion selection, higher space charge capacities can be attained if higher resonance ejection voltages are used;

d. higher scan rates (and higher resonance ejection voltages) allow greater ion storage capacity but lower m/z resolution;

e. to reduce the scan time for given scan rate, all precursor mass range of interest could be split into a set of discrete precursor m/z ranges or windows, preferably corresponding to about the width of a single isotopic cluster of m/z peaks of a typical precursor analyte ion species. Then frequency of resonance excitation or the RF trapping voltage jumps so that one selected precursor m/z range after another are resonantly ejected next without necessarily even exciting ions in-between these ranges. This set of masses could be determined by a preliminary fast scan either in LTMS 30 or TOF 70 for much smaller number of ions, similar to an AGC prescan experiment. Along with determining the intensity for each precursor ion, it allows improved optimization of conditions (scan rate, voltages, etc.) for each precursor ion ("automatic precursor control"). Such preliminary information could be used also for optimising injection waveforms during ion storage in LTMS 30.

f. using lower $q_{eject}$ reduces m/z resolution and ion storage capacity in the linear trap 30 but will reduce the KE (kinetic energy) and KE spread of ions when they are ejected from the linear trap 30. This will effect choice of the gas pressure in the collision cell/ion guide 50 and its dimensions;

g. increasing the RF frequency will increase the available resolution and charge capacity of the ion guide 50 but the RF voltage increases as $f^2$; or 2. Linear Trap Collision Cell Pressure-Length (PXD) Product:

a. higher P×D will stop/fragment higher energy precursor ions;

b. higher P×D will result in slower ion transit and a wider distribution of ion transit times.

In some embodiments, to facilitate efficient ion fragmentation in the collision cell, 50 the effective target thickness of gas, P×D, should be greater than 0.1 . . . 1 Torr×mm, where P is gas pressure, D is length of the collision cell 50. It may be desirable to have the time distribution for associated precursor and fragment ions to transit though the collision cell/planar ion guide 50 not more than 500-2000 microseconds. Such a distribution in exit time delays can be achieved if D is less than 30 . . . 50 mm which would require P to be greater than 20 . . . 30 mTorr (see for example C. Hoaglund-Hyzer, J. Li and D. E. Clemmer; Anal.Chem. 72 (2000) 2737-2740). A higher P×D product may be required to facilitate better cooling and capture of precursor ions and their associated fragmentation product ions. With such pressures in the collision cell/ion guide 50 it would necessitate an additional differential pumping stage between the collision cell 50 and the TOF analyzer 70. This can be achieved, for example, by evacuating lenses 60 by the same pump as LTMS 30, and having an additional pump to evacuate just the entrance to the collision cell 50 (between the envelope 51 and, for example, electrodes 53 or 56). The lenses 60 provide very precise transformation of the ion beam exiting the collision cell/ion guide 50 into a parallel beam with orthogonal energy spread of a few milliVolts. This lens region should be preferably maintained at pressure in or below 10-5 mbar range to avoid scattering, fragmentation and to minimize gas flow into the TOF analyzer chamber 80.

To improve sensitivity of the TOF analyzer 50 and thus quality of MS/MS spectra, its transmission and duty cycle need to be improved, for example by any of the following ways:

a) Gridless optics and especially gridless orthogonal accelerator could be described as in A. A. Makarov, WO01/11660.

b) Fresnel-type multi-electrode lenses could be used to improve duty cycle as described in A. A. Makarov, D. R. Bandura, *Int. J. Mass Spectrom. Ion Proc.*, v. 127 (1993) pp 45-55.

c) Time of flight analyzer could be more closely integrated with the collision cell by pulsing ions directly from the gas-filled ion guide 50 or 55 into the flight tube, similar to ion pulsing described in A. A. Makarov, M. E. Hardman, J. C. Schwartz, M. Senko, WO02/078046.

Figure 13:
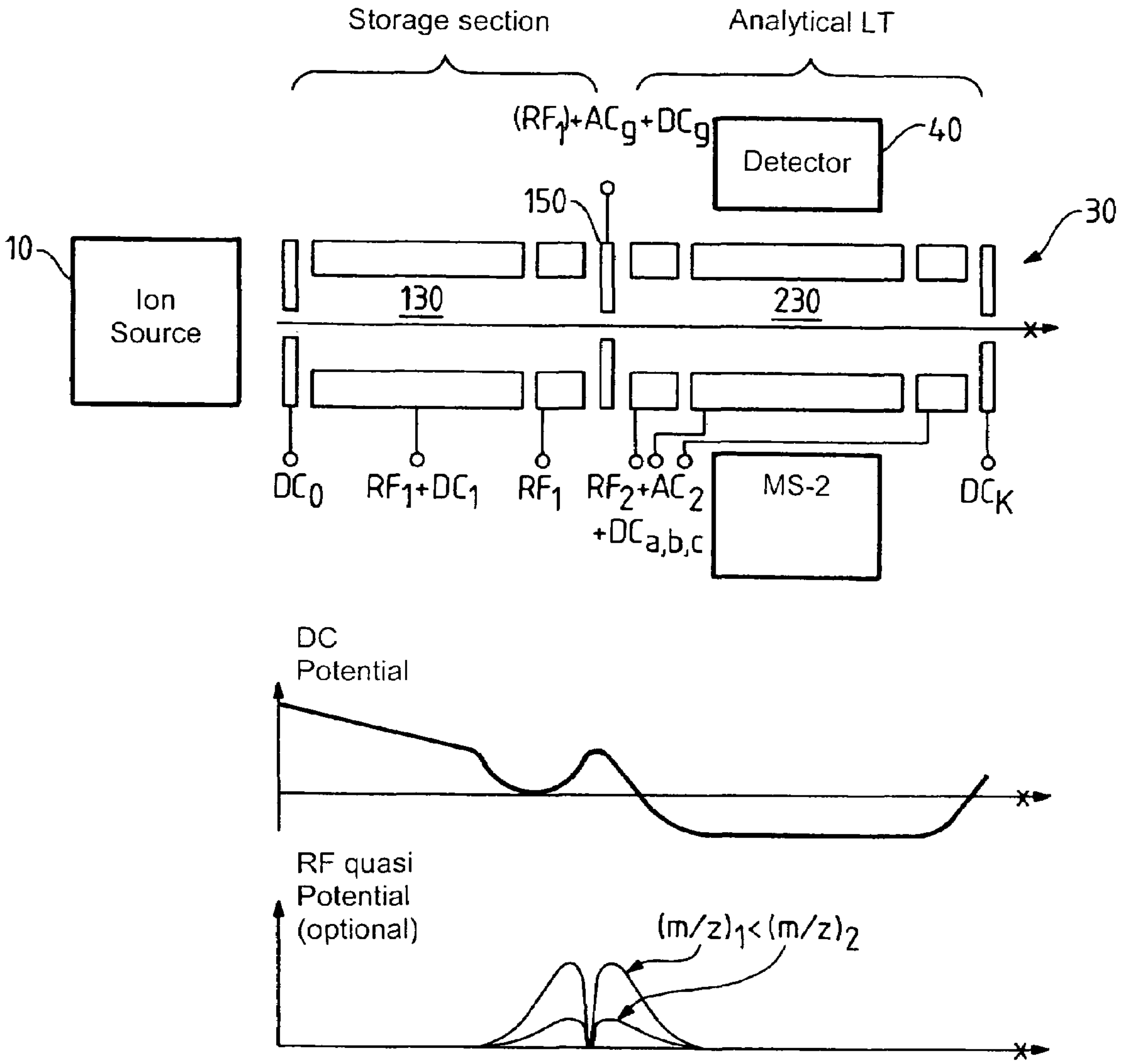
FIG. 13 shows an ion source and composite ion trap according to an embodiment of the present invention.

The embodiments described above can be improved for situations where the space charge capacity of LTMS 30 may otherwise become a crucial limitation. It is proposed to overcome this potential problem by using an additional ion storage device prior to the linear trap 30. This device is preferably a further linear trap. A particularly preferred arrangement is shown in FIG. 13.

Here, the linear trap 30 is effectively split into two sections: a first, storage section 130, followed by a second, analytical section 230. These sections 130 and 230 are separated by an electrode 150 upon which a potential can be set to create a potential barrier to divide the linear trap 30 into the two sections 130, 230. This potential barrier need only provide a certain potential energy step to separate the storage sections and may be implemented using electric and/or magnetic fields. The storage section 130 captures incoming ions (preferably, continuously) and, at the same time, excites ions within intermediate mass range Δm/z (10-200 Th) to overcome the potential barrier separating the storage section 130 from the analytical section 230 for subsequent MS-only or MS/MS or $MS^n$ analysis over this range. By exciting ions within discrete mass ranges Δm/z that step through the entire mass range (e.g. 200 Th to 2000 Th), this allows use of all the space charge capacity of the analytical section 230 at each step Δm/z without sacrificing sensitivity, scanning speed or resolving power of the LTMS 30.

Though the m/z range stored in the storage section 130 is too wide for any useful information about ions due to space charge effects, the space charge admitted into the high-resolution linear trap analyzer in the analytical section 230 is reduced relative to the entire m/z range. Also, the two sections 130, 230 are synchronized in such a manner that for MS-only scan, the linear trap 30 always scans within the admitted mass range Δm/z, so there is no compromise for time of analysis.

In operation, a continuous stream of ions enters storage section 130 and reflects from the potential barrier separating the sections 130 and 230. The potential barrier is formed by a combination of DC and, optionally, RF fields. Ions in the storage section 130 lose kinetic energy in collisions with gas along the length of the storage section 130 and continuously store near the minimum of potential well. At the same time, an AC field is added to the potential barrier so that resonant axial oscillations of ions within a particular m/z range Δm/z are excited. This could be achieved, for example, by providing a quadratic DC potential distribution along the axis of storage section 130. Due to severe space charge effects and poor quality of the field, this intermediate m/z range Δm/z is much higher than 1 Th, preferably 5-10% of the total mass range. Also, AC excitation could span over the appropriate range of frequencies so that excitation is less dependent on the actual distortions of local fields.

After several tens or hundreds of excitation cycles, the majority of ions within the intermediate m/z range Δm/z are excited to such an extent that they are able to overcome the potential barrier (while still not able to escape through the entrance aperture of the storage selection 130). This allows the ions to enter the analytical section 230 where they are out of resonance with an AC field that exists therein, and the ions get stored in the middle part of this section 230 due to further loss of their energy in collisions with gas to reside in the minimum of the potential well. Then, an analytical MS-only or MS/MS or $MS^n$ scan is taken over the pre-selection mass range of the'stored ions. After that, the process of filling from the storage section 130 is repeated for the next pre-selection m/z range, and so on until the total mass range is covered and the scans are thus completed. By the start of the next scans, the ion population within the storage section 130 is already completely renewed.

An example of operating a mass spectrometer including the composite linear trap 30 of FIG. 13 will now be described.

A typical space charge limit for unit resolving power of the linear trap is 30,000 charges and the ion intensity is distributed approximately uniformly over operating mass range of 2000 Th. Due to the high resolving power of TOFMS, higher ion populations (e.g. 300,000 charges) could be accepted. The scanning speed is 10,000 Th/s, and the input current is approximately 30,000,000 charges/s. AGC is used to estimate intensity distribution of ions and the linear trap 30 operates in MS-only mode.

With the conventional approach, the linear trap 30 would have been filled for 10 ms to reach the allowed space charge limit and the LTMS 30 would be scanned for 200 ms to cover the required mass range. Taking into account settling and AGC times, this results in about 4 spectra/sec or 1,200,000 charges analyzed per second to give a duty cycle of 4%.

With the proposed approach, all ions are being stored in the storage section 130 prior to analysis in the analytical section 230. After 300,000 charges are injected into the analytical section 230 within a m/z window of 100 Th over few ms, only 10 ms is needed to scan over this m/z window. The entire mass range is covered in a time slightly above 200 ms in 20 steps, each step containing 300,000 charges. The process could be run at a rate of about 4 spectra/sec if storage in 130 is accompanied by excitation, and about 2.5 spectra/sec, if storage and excitation are sequential in time. For the first case, 24,000,000 charges are analyzed per second to give a duty cycle of 80%, while for the second case 15,000,000 charges are analyzed per second resulting in a duty cycle of 50%.

Whilst narrower m/z windows Δm could be used, overhead time consumption is, however, likely to limit further gains at a level of about $50 \cdot 10^6$ charges/second which is already close to the practical limit of modern electrospray sources.

A number of embodiments of the invention have been described. Nevertheless, it will be understood that various modifications may be made without departing from the spirit and scope of the invention.

What is claimed:

1. A collision cell/planar ion guide for transporting an ion beam from an ion entrance to an ion exit, the ion beam having a cross-section at the ion entrance that is expanded in one dimension relative to the other dimension, the collision cell/planar ion guide comprising:

a plurality of elongated rod electrodes;

a radio-frequency voltage source for applying RF voltages to the plurality of rod electrodes; and means for focusing the ion beam in a dimension transverse to the primary direction of ion travel such that the cross-section of the ion beam at an ion exit is reduced relative to the ion beam cross-section at the ion inlet, wherein the means for focusing includes a DC voltage source configured to apply DC offsets to a plurality of electrodes.

2. The collision cell/planar ion guide of claim 1, wherein the plurality of rod electrodes are oriented generally parallel to the primary direction of ion travel, and the means for focusing includes a DC voltage source configured to apply DC offsets to the plurality of rod electrodes, the DC offsets being selected to generate a DC field gradient in the transverse dimension that focuses the ion beam toward a central axis.

3. The collision cell/planar ion guide of claim 1, wherein the means for focusing includes a plurality of field electrodes positioned outwardly of the rod electrodes, the field electrodes having DC offsets applied thereto and being shaped to generate a DC field gradient in the transverse dimension that focuses the ion beam toward a central axis.

4. The collision cell/planar ion guide of claim 3, wherein the field electrodes are further shaped to generate a DC axial field gradient that acts to propel ions along the primary direction of travel.

5. The collision cell/planar ion guide of claim 1, wherein the plurality of rod electrodes are oriented generally transversely with respect to the primary direction of ion travel, and the means focusing the ion beam comprises a set of field electrodes positioned outwardly of the rod electrodes, the field electrodes having DC offsets applied thereto and being shaped to generate a DC field gradient in the transverse dimension that focuses the ion beam toward a central axis.

6. The collision cell/planar ion guide of claim 1, wherein the plurality of rod electrodes includes composite electrodes, each composite electrode having first and second sub rods to which an identical RF voltage is applied, and wherein the means for focusing includes a DC voltage source configured to apply different DC offsets to the first and second sub rods plurality of rod electrodes to generate a DC field gradient in the transverse dimension that focuses the ion beam toward a central axis.

7. The collision cell/planar ion guide of claim 1, wherein the interior of the collision cell/planar ion guide is filled with a collision gas such that at least a portion of the ions of the ion beam are dissociated to form product ions.

8. The collision cell/planar ion guide of claim 1, further comprising first and second end electrodes respectively positioned adjacent to the ion entrance and ion exit, the first and second electrodes having DC offsets applied thereto such that ions are axially confined to and trapped within the interior of the collision cell/planar ion guide.

9. A method of collimating a generally ribbon-shaped ion beam, comprising:

providing a first ion guide including a plurality of elongated rod electrodes arranged to define an interior volume having first and second dimensions transverse to the primary direction of ion flow, the first dimension being enlarged relative to the second dimension, the plurality of rod electrodes further defining an ion entrance and an ion exit;

applying RF voltages to the plurality of rod electrodes to generate an oscillating field that confines ions in the first and second dimensions; and generating a DC field gradient in the first dimension that causes the ion beam to be focused toward a central axis as the ions travel from the ion entrance to the ion exit.

10. The method of claim 9, further comprising generating a DC field gradient in the primary direction of ion flow to assist in propelling ions between the ion entrance and the ion exit.

11. The method of claim 9, further comprising providing a second quadrupole ion guide positioned immediately downstream in the ion path from the first ion guide, the second ion guide effecting additional focusing of the ion beam in the dimensions transverse to the primary direction of ion flow through the second ion guide.

12. The method of claim 9, wherein the step of generating a DC field gradient includes applying DC offsets to field electrodes positioned outwardly of the rod electrodes.

13. The method of claim 9, wherein the step of generating a DC field gradient includes applying DC offsets to the plurality of rod electrodes, wherein at least one of the DC offsets applied to one of the rod electrodes differs from the DC offset applied to another of the rod electrodes.

14. The method of claim 9, further comprising axially confining ions to the interior volume of the first ion guide.

15. A planar ion guide for combining first and second ion beams to form a combined ion beam, the ion beams having axes oriented transversely with respect to each other, the planar ion guide comprising:

a plurality of elongated rod electrodes arranged to define an interior volume having first and second dimensions transverse to the direction of elongation, the first dimension being enlarged relative to the second dimension, the rod electrodes defining an end ion entrance through which the first ion beam is admitted to the interior volume, a side ion entrance through which the second ion beam is admitted to the interior volume, and an end ion exit, axially opposed to the end ion entrance, through which the combined ion beam is emitted;

a radio-frequency voltage source for applying RF voltages to the plurality of rod electrodes to confine ions of the first and second ion beams in the first and second transverse dimensions;

means for generating a DC field gradient in the first dimension that causes the first and second ion beams to be focused toward a central axis; and means for generating an axial DC field gradient that propels ions of the first and second ion beams toward the end ion exit.

16. The planar ion guide of claim 15, wherein the means for generating a DC field gradient in the first dimension includes a plurality of field electrodes, positioned outwardly of the rod electrodes, to which DC offsets are applied.

17. The planar ion guide of claim 15, wherein the means for generating an axial DC field gradient includes a plurality of field electrodes, positioned outwardly of the rod electrodes, to which DC offsets are applied.

18. The planar ion guide of claim 15, wherein the plurality of rod electrodes includes composite electrodes, each composite electrode having first and second sub rods to which an identical RF voltage is applied, and wherein the means for generating a DC field gradient in the first dimension includes a DC voltage source configured to apply different DC offsets to the first and second sub rods of the plurality of rod electrodes.

* * * * *